US010854477B2

(12) United States Patent
Otsuji

(10) Patent No.: US 10,854,477 B2
(45) Date of Patent: Dec. 1, 2020

(54) SUBSTRATE PROCESSING APPARATUS AND SUBSTRATE PROCESSING METHOD

(71) Applicant: SCREEN Holdings Co., Ltd., Kyoto (JP)

(72) Inventor: Masayuki Otsuji, Kyoto (JP)

(73) Assignee: SCREEN Holdings Co., Ltd.

( * ) Notice: Subject to any disclaimer, the term of this patent is extended or adjusted under 35 U.S.C. 154(b) by 253 days.

(21) Appl. No.: 15/605,097

(22) Filed: May 25, 2017

(65) Prior Publication Data
US 2017/0345682 A1 Nov. 30, 2017

(30) Foreign Application Priority Data

May 25, 2016 (JP) .................................. 2016-104599
Jan. 12, 2017 (JP) .................................. 2017-003510

(51) Int. Cl.
*B08B 3/04* (2006.01)
*B08B 3/08* (2006.01)
*H01L 21/67* (2006.01)
*H01L 21/677* (2006.01)

(52) U.S. Cl.
CPC ........ *H01L 21/67017* (2013.01); *B08B 3/041* (2013.01); *B08B 3/08* (2013.01); *H01L 21/67028* (2013.01); *H01L 21/67051* (2013.01); *H01L 21/67706* (2013.01)

(58) Field of Classification Search
CPC ..... B08B 3/041; B08B 3/08; H01L 21/67017; H01L 21/67028; H01L 21/67051; H01L 21/67706
USPC ...... 134/21, 33, 94.1, 95.1, 103.2, 119, 144, 134/153, 157, 902
See application file for complete search history.

(56) References Cited

U.S. PATENT DOCUMENTS

| 7,387,455 | B2 | 6/2008 | Awamura et al. ............ 396/631 |
| 7,722,736 | B2 | 5/2010 | Miya ........................ 156/345.17 |
| 2004/0222323 | A1 | 11/2004 | Akasaka et al. ............. 239/565 |
| 2005/0223980 | A1 | 10/2005 | Awamura et al. ........... 118/708 |
| 2005/0276921 | A1 | 12/2005 | Miya et al. .................. 427/240 |
| 2006/0021636 | A1 | 2/2006 | Miya .............................. 134/33 |
| 2006/0102289 | A1 | 5/2006 | Fukatsu et al. .......... 156/345.55 |

(Continued)

FOREIGN PATENT DOCUMENTS

| CN | 1727081 B | 6/2011 |
| CN | 102107197 A | 6/2011 |

(Continued)

*Primary Examiner* — Levon J Shahinian
(74) *Attorney, Agent, or Firm* — Ostrolenk Faber LLP

(57) ABSTRACT

A substrate processing apparatus includes a substrate holding unit that holds a substrate horizontally while rotating the substrate around a vertical rotational axis running through its center portion, an opposed member having an opposed surface that is opposed to an upper surface of the substrate, and a processing liquid discharge unit that includes a center portion discharge port on the opposed surface, that opens being opposed to the upper surface center portion of the substrate, and a peripheral portion discharge port on the opposed surface, that opens being opposed to the upper surface peripheral portion of the substrate, that discharges a processing liquid from the center portion discharge port to supply the processing liquid between the substrate and the opposed surface, and discharges the processing liquid from the peripheral portion discharge port to replenish the processing liquid between the substrate and the opposed surface.

13 Claims, 12 Drawing Sheets

(56) References Cited

U.S. PATENT DOCUMENTS

| | | |
|---|---|---|
| 2007/0012339 A1 | 1/2007 | Fukuda et al. .................. 134/26 |
| 2007/0240743 A1 | 10/2007 | Hiroe et al. ................. 134/94.1 |
| 2016/0096205 A1 | 4/2016 | Kato |
| 2016/0276379 A1 | 9/2016 | Hamada et al. |

FOREIGN PATENT DOCUMENTS

| | | |
|---|---|---|
| JP | 2006-140385 A | 6/2006 |
| JP | 2006-216794 A | 8/2006 |
| JP | 2010-123884 | 6/2010 |
| JP | 2014-209582 A | 11/2014 |
| JP | 2015-042404 A | 3/2015 |
| KR | 10-2004-0071141 A | 8/2004 |
| KR | 10-2009-0118945 A | 11/2009 |
| KR | 10-2016-0021236 A | 2/2016 |
| TW | 200805480 A | 1/2008 |

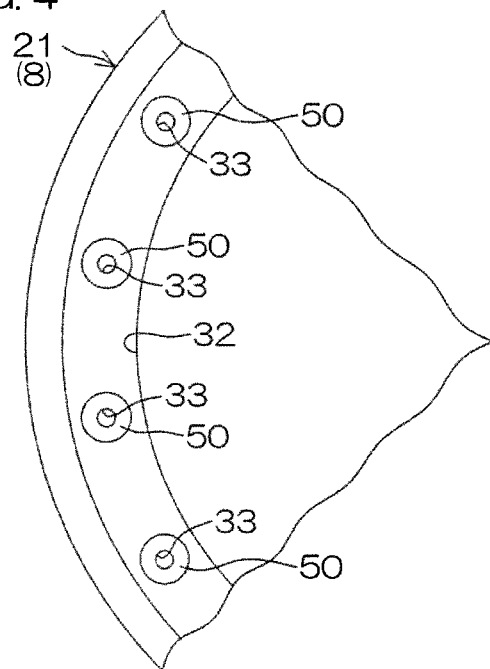
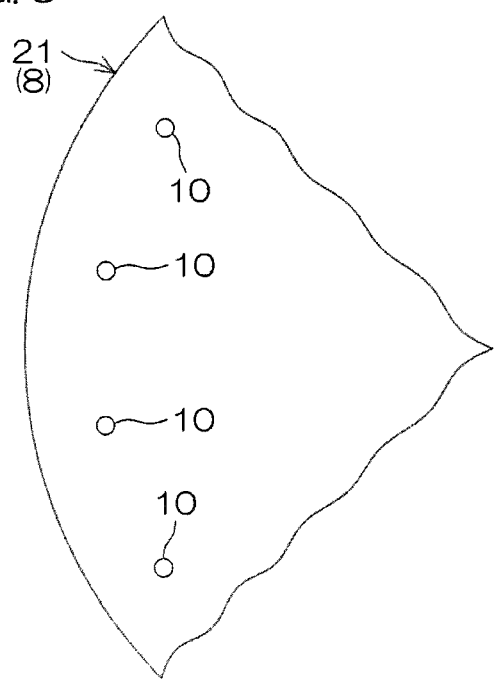

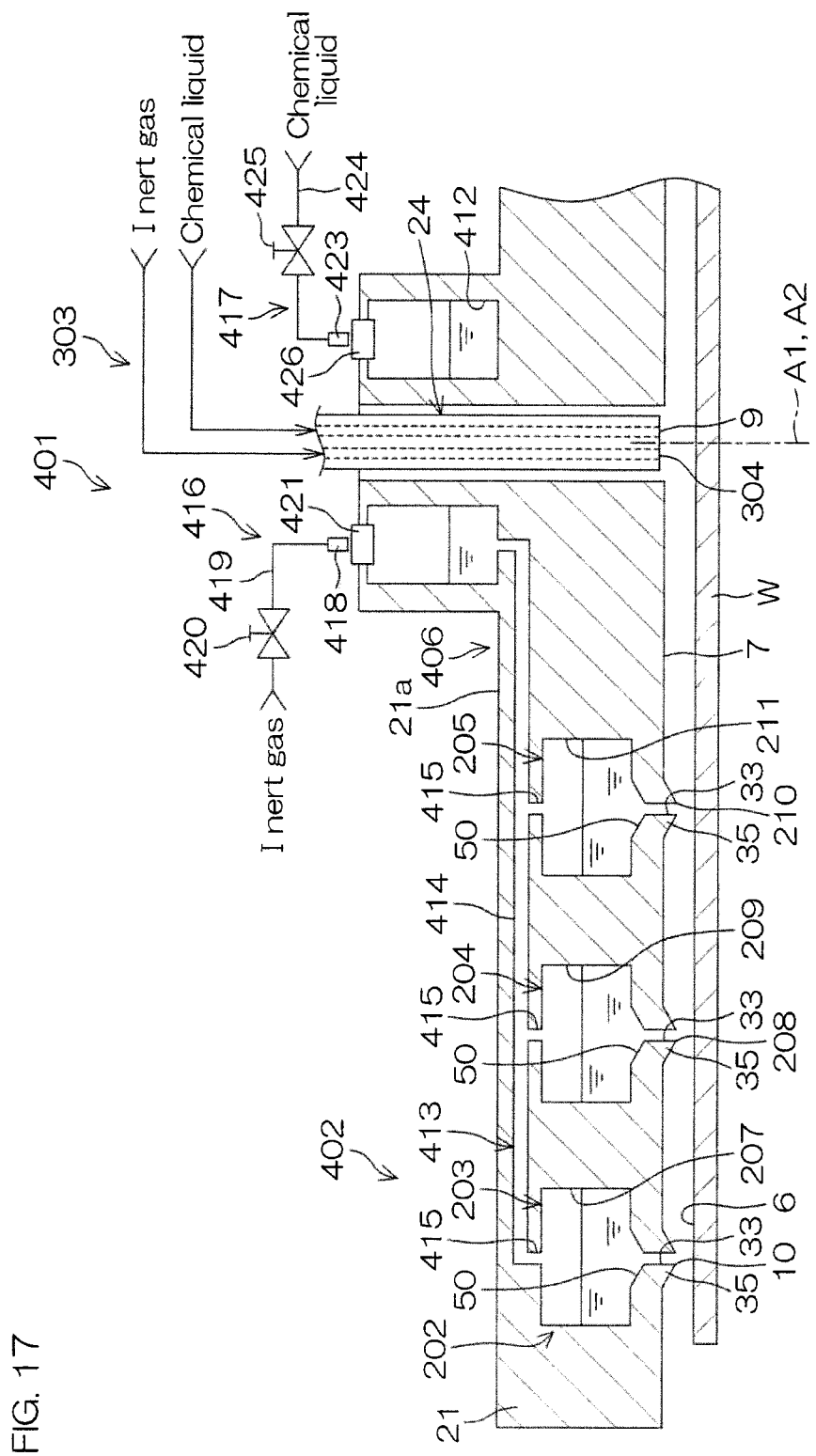

SUBSTRATE PROCESSING APPARATUS AND SUBSTRATE PROCESSING METHOD

BACKGROUND OF THE INVENTION

1. Field of the Invention

The present invention relates to a substrate processing apparatus and a substrate processing method. Examples of substrates to be processed include semiconductor wafers, substrates for liquid crystal displays, substrates for plasma displays, substrates for FEDs (field emission displays), substrates for optical disks, substrates for magnetic disks, substrates for magneto-optical disks, substrates for photomasks, ceramic substrates, substrates for solar cells, etc.

2. Description of Related Art

In the manufacturing steps for semiconductor devices and liquid crystal display devices, processing is carried out using processing liquids on the substrates, which may be semiconductor wafers or glass panels for liquid crystal displays. Japanese Unexamined Patent Application Publication No. 2010-123884 discloses a single substrate processing type substrate processing apparatus that conducts processing of one substrate at a time. This publication proposes carrying out processing on the entire area of the upper surface of a substrate, while keeping the region between the upper surface of the substrate and the lower surface of a shield plate in a fluid-tight state for the processing liquid. Specifically, the shield plate is situated proximal to the upper surface of the substrate and discharges the processing liquid from a center portion discharge port provided at the center portion of the lower surface of the shield plate (being opposed to the center portion of the upper surface of the substrate at the lower surface of the shield plate), thus supplying the processing liquid in the narrow space between the upper surface of the substrate and the lower surface of the shield plate. The processing liquid discharged from the center portion discharge port into the narrow space fills up the narrow space.

SUMMARY OF THE INVENTION

In the method described in Japanese Unexamined Patent Application Publication No. 2010-123884, however, since the processing liquid is supplied only from the center portion discharge port into the narrow space, the processing liquid can potentially drip off at the peripheral portion of the substrate. Consequently, the region between the upper surface peripheral portion of the substrate and the opposed surface may not be sufficiently filled with the processing liquid.

When the region between the upper surface peripheral portion of the substrate and the opposed surface fails to be sufficiently filled with the processing liquid, at least a part of the upper surface peripheral portion of the substrate can potentially become exposed to the atmosphere between the upper surface peripheral portion and the opposed surface.

When this occurs, the processing rate at the upper surface peripheral portion of the substrate is reduced, and may result in unprocessed sections in the upper surface peripheral portion of the substrate. The upper surface of the substrate may fail to be evenly processed as a result.

In other words, in order to evenly process the upper surface of the substrate with the processing liquid, it is desirable to satisfactorily fill not only the region between the center portion of the upper surface of the substrate and the opposed surface but also the region between the upper surface peripheral portion of the substrate and the opposed surface, with the processing liquid.

It is therefore an object of the present invention to provide a substrate processing apparatus and substrate processing method that can satisfactorily fill not only the region between the center portion of the upper surface of the substrate and the opposed surface but also the region between the upper surface peripheral portion of the substrate and the opposed surface with the processing liquid, thereby allowing the upper surface of the substrate to be evenly processed with the processing liquid.

The present invention provides a substrate processing apparatus including a substrate holding unit that holds a substrate horizontally while rotating the substrate around a vertical rotational axis running through its center portion, an opposed member having an opposed surface that is opposed to an upper surface of the substrate, and a processing liquid discharge unit that includes a center portion discharge port on the opposed surface that opens being opposed to the center portion of the upper surface of the substrate, and a peripheral portion discharge port on the opposed surface that opens being opposed to the upper surface peripheral portion of the substrate, that discharges a processing liquid from the center portion discharge port to supply the processing liquid between the substrate and the opposed surface, and discharges the processing liquid from the peripheral portion discharge port to replenish the processing liquid between the substrate and the opposed surface.

According to this arrangement, the processing liquid discharged from the peripheral portion discharge port replenishes the processing liquid between the upper surface peripheral portion of the substrate and the opposed surface, allowing the processing liquid to be adequately spread over the upper surface peripheral portion of the substrate. It is thereby possible to satisfactorily fill not only the region between the center portion of the upper surface of the substrate and the opposed surface but also the region between the upper surface peripheral portion of the substrate and the opposed surface with the processing liquid, and thus to evenly process the upper surface of the substrate with the processing liquid.

According to a preferred embodiment of the invention, the processing liquid discharge unit includes a liquid reservoir provided in the opposed member, that is capable of accumulating the processing liquid discharged from the peripheral portion discharge port.

According to this arrangement, the processing liquid accumulated in the liquid reservoir provided in the opposed member is discharged from the peripheral portion discharge port. Since both a liquid reservoir and a peripheral portion discharge port are provided on the peripheral portion, it is possible to satisfactorily supply the processing liquid to the peripheral portion discharge port.

In addition, the processing liquid discharge unit may further include a connecting hole that connects the interior of the liquid reservoir with the peripheral portion discharge port. In this case, fluid will be distributed between the upper surface peripheral portion of the substrate and the peripheral portion discharge port on the opposed surface, and the reduced pressure of the connecting hole as the fluid is distributed may be used to discharge the processing liquid accumulated in the liquid reservoir from the peripheral portion discharge port via the connecting hole.

According to this arrangement, the peripheral portion discharge port and the connecting hole are brought to reduced pressure as the fluid flows between the upper surface peripheral portion of the substrate and the opposed surface. With the processing liquid accumulated in the liquid reservoir, reduced pressure in the peripheral portion discharge port and the connecting hole causes the processing liquid accumulated in the liquid reservoir to be guided to the connecting hole by the Venturi effect, and discharged from the peripheral portion discharge port. Therefore, with the processing liquid accumulated in the liquid reservoir, the processing liquid is discharged from the peripheral portion discharge port as fluid is distributed between the upper surface peripheral portion of the substrate and the opposed surface. As a result, it is generally possible to provide an arrangement in which the processing liquid can be discharged from the peripheral portion discharge port when the processing liquid has been accumulated in the liquid reservoir and the fluid has been distributed between the upper surface peripheral portion of the substrate and the opposed surface.

The fluid that is distributed between the upper surface peripheral portion of the substrate and the area surrounding the peripheral portion discharge port on the opposed surface may also be the processing liquid.

With such an arrangement, the peripheral portion discharge port and the connecting hole are brought to reduced pressure as the processing liquid flows between the upper surface peripheral portion of the substrate and the opposed surface. With the processing liquid accumulated in the liquid reservoir, reduced pressure in the peripheral portion discharge port and the connecting hole causes the processing liquid accumulated in the liquid reservoir to be guided to the connecting hole by the Venturi effect, and discharged from the peripheral portion discharge port. Consequently, as the processing liquid that has been discharged from the center portion discharge port is distributed between the upper surface peripheral portion of the substrate and the opposed surface, with the processing liquid accumulated in the liquid reservoir, the processing liquid can be discharged from the peripheral portion discharge port. This allows the processing liquid to be discharged from the peripheral portion discharge port without processing liquid being delivered out to the peripheral portion discharge port, thereby making it possible to eliminate any arrangement for delivering out the processing liquid to the peripheral portion discharge port.

The fluid that is distributed between the upper surface peripheral portion of the substrate and the area surrounding the peripheral portion discharge port on the opposed surface may also be a gas.

With such an arrangement, the peripheral portion discharge port and the connecting hole are brought to reduced pressure as the gas flows between the upper surface peripheral portion of the substrate and the opposed surface. With the processing liquid accumulated in the liquid reservoir, reduced pressure in the peripheral portion discharge port and the connecting hole causes the processing liquid accumulated in the liquid reservoir to be guided to the connecting hole by the Venturi effect, and discharged from the peripheral portion discharge port. Therefore, while the processing liquid is in an accumulated state in the liquid reservoir, the processing liquid is discharged from the peripheral portion discharge port as gas is distributed between the upper surface peripheral portion of the substrate and the opposed surface. As a result, it is generally possible to provide an arrangement in which the processing liquid can be discharged from the peripheral portion discharge port when the processing liquid has been accumulated in the liquid reservoir and the gas has been distributed between the upper surface peripheral portion of the substrate and the opposed surface.

Protrusions may also be provided on the opposed surface, in the area surrounding the peripheral portion discharge port, in order to increase the flow rate of the fluid flowing between the upper surface peripheral portion of the substrate and the area surrounding the peripheral portion discharge port on the opposed surface.

With such an arrangement, providing protrusions on the opposed surface can increase the flow rate of fluid flowing between the upper surface peripheral portion of the substrate and the area surrounding the peripheral portion discharge port on the opposed surface. It will thus be possible to increase the volume of processing liquid guided from the liquid reservoir to the peripheral portion discharge port via the connecting hole. As a result, it will be possible to discharge processing liquid at a sufficient flow rate from the peripheral portion discharge port.

A thick portion may also be provided on the opposed surface, further toward the peripheral portion of the opposed member than the peripheral portion discharge port, in order to increase the flow rate of the fluid flowing between the upper surface peripheral portion of the substrate and the area surrounding the peripheral portion discharge port on the opposed surface.

With such an arrangement, providing a thick portion on the opposed surface further toward the peripheral portion of the opposed member than the peripheral portion discharge port can increase the flow rate of fluid flowing between the upper surface peripheral portion of the substrate and the area surrounding the peripheral portion discharge port on the opposed surface. This will increase the volume of processing liquid guided from the liquid reservoir to the peripheral portion discharge port via the connecting hole. As a result, it will be possible to discharge processing liquid at a sufficient flow rate from the peripheral portion discharge port.

Moreover, the peripheral portion discharge port may be set to a size such that the processing liquid is not discharged from the peripheral portion discharge port when the processing liquid is not flowing between the upper surface peripheral portion of the substrate and the part of the opposed surface surrounding the peripheral portion discharge port.

With such an arrangement, the peripheral portion discharge port is formed with a small enough size so that the processing liquid is not supplied to the peripheral portion discharge port when the fluid is not flowing between the upper surface peripheral portion of the substrate and the part of the opposed surface surrounding the peripheral portion discharge port. Although force acts on the processing liquid accumulated in the liquid reservoir toward the peripheral portion discharge port, by the weight of the processing liquid itself, the processing liquid is not discharged from the peripheral portion discharge port when the fluid is not flowing between the upper surface peripheral portion of the substrate and the part of the opposed surface surrounding the peripheral portion discharge port. The processing liquid begins to be discharged from the peripheral portion discharge port only by the Venturi effect, when fluid between the upper surface peripheral portion of the substrate and the part of the opposed surface surrounding the peripheral portion discharge port is distributed. Since the processing liquid is not discharged from the peripheral portion discharge port when the fluid is not flowing between the upper surface peripheral portion of the substrate and the part of the opposed surface surrounding the peripheral portion discharge port, it is possible to accumulate the processing liquid in the liquid reservoir prior to the timing of discharge of the peripheral portion discharge port.

The liquid reservoir may also include a liquid reservoir groove formed on a surface of the opposed member opposite the opposed surface.

With such an arrangement, the liquid reservoir includes a liquid reservoir groove formed on the opposite side, thereby allowing the liquid reservoir to be provided in a more simple manner. Moreover, by providing a processing liquid supply unit being opposed to the liquid reservoir groove, it is possible to easily accomplish supply of the processing liquid to the liquid reservoir.

The substrate processing apparatus may further include an opposed member rotating unit that rotates the opposed member around a rotational axis. In this case, the liquid reservoir may further include an embankment that restricts outflow of the processing liquid that has accumulated in the liquid reservoir groove, from the liquid reservoir groove.

With such an arrangement, it is possible to effectively restrict outflow of the processing liquid from the liquid reservoir groove, even when the opposed member is rotated around the rotational axis. This allows the processing liquid in the liquid reservoir to be satisfactorily accumulated.

The liquid reservoir may further include a hood portion that protrudes from the top edge of the embankment toward the radially inner side of the opposed member.

With such an arrangement, the hood portion can even more effectively restrict outflow of the processing liquid from the liquid reservoir groove. This allows the processing liquid in the liquid reservoir to be even more satisfactorily accumulated.

The liquid reservoir may also further include a liquid reservoir space formed inside the opposed member.

With such an arrangement, it is possible to effectively prevent outflow of the processing liquid from the liquid reservoir groove, even when the opposed member is rotated around the rotational axis. This allows the processing liquid in the liquid reservoir to be satisfactorily accumulated.

There may be further included a processing liquid supply unit that supplies processing liquid to the liquid reservoir. In this case, the processing liquid supply unit can supply processing liquid to the liquid reservoir when discharge of processing liquid from the center portion discharge port is initiated.

With such an arrangement, processing liquid is supplied to the liquid reservoir when discharge of processing liquid from the center portion discharge port is initiated. After discharge of processing liquid from the center portion discharge port has been initiated, discharge of processing liquid from the peripheral portion discharge port is then initiated. Thus, processing liquid accumulates in the liquid reservoir when discharge of processing liquid from the peripheral portion discharge port is initiated. Since processing liquid can be discharged from the peripheral portion discharge port while the processing liquid is in an accumulated state in the liquid reservoir, discharge of the processing liquid from the peripheral portion discharge port can be accomplished in a satisfactory manner.

A plurality of peripheral portion discharge ports may also be provided along the circumferential direction of the opposed member.

Since a plurality of peripheral portion discharge ports are provided along the circumferential direction of the opposed member according to this arrangement, it is possible to replenish the processing liquid in a sufficient amount between the upper surface peripheral portion of the substrate and the opposed surface. This allows the region between the upper surface peripheral portion of the substrate and the opposed surface to be more satisfactorily filled with processing liquid.

The processing liquid may also include a chemical liquid.

The substrate processing apparatus may also be an apparatus for removal of a resist from the upper surface of the substrate. In this case, the chemical liquid may be ozone water that removes a resist from the substrate.

With such an arrangement, the region between the substrate and the opposed surface is filled not only by ozone water discharged from the center portion discharge port, but also by ozone water discharged from the peripheral portion discharge port. Since the ozone water discharged from the peripheral portion discharge port replenishes the ozone water between the upper surface peripheral portion of the substrate and the opposed surface, it is possible to adequately spread the processing liquid over the upper surface peripheral portion of the substrate. It is thereby possible to satisfactorily fill not only the region between the center portion of the upper surface of the substrate and the opposed surface but also the region between the upper surface peripheral portion of the substrate and the opposed surface with the ozone water. It is therefore possible to satisfactorily remove not only the resist on the center portion of the upper surface of the substrate, but also the resist on the upper surface peripheral portion of the substrate, and therefore to satisfactorily remove the resist over the entire region of the upper surface of the substrate.

The present invention further provides a substrate processing method wherein the upper surface of a substrate is processed with a processing liquid from a processing liquid discharge unit including a center portion discharge port on an opposed surface being opposed to the upper surface of the substrate, that opens being opposed to the center portion of the upper surface of the substrate, and a peripheral portion discharge port on the opposed surface, that opens being opposed to the upper surface peripheral portion of the substrate, the substrate processing method including a substrate rotating step in which the substrate is rotated around a vertical rotational axis running through its center portion, and a processing liquid discharging step in which, simultaneously with the substrate rotating step, the processing liquid is discharged from the center portion discharge port to supply the processing liquid between the substrate and the opposed surface, in order to discharge the processing liquid from the center portion discharge port and fill the region between the substrate and the opposed surface with the processing liquid, and the processing liquid is discharged from the peripheral portion discharge port to replenish the processing liquid between the substrate and the opposed surface.

According to this method, the region between the substrate and the opposed surface is filled not only by processing liquid discharged from the center portion discharge port, but also by processing liquid discharged from the peripheral portion discharge port. The processing liquid discharged from the peripheral portion discharge port replenishes the processing liquid between the upper surface peripheral portion of the substrate and the opposed surface, allowing the processing liquid to be adequately spread over the upper surface peripheral portion of the substrate. It is thereby possible to satisfactorily fill not only the region between the center portion of the upper surface of the substrate and the opposed surface but also the region between the upper surface peripheral portion of the substrate and the opposed surface with the processing liquid, and thus to evenly process the upper surface of the substrate with the processing liquid.

The processing liquid unit may include a liquid reservoir that can accumulate the processing liquid discharged from the peripheral portion discharge port, and the method may further include a processing liquid supplying step in which the processing liquid is supplied to the liquid reservoir when the processing liquid supplying step is initiated.

According to this method, processing liquid is supplied to the liquid reservoir when discharge of processing liquid from the center portion discharge port is initiated. After discharge of processing liquid from the center portion discharge port has been initiated, discharge of processing liquid from the peripheral portion discharge port is then initiated. Thus, processing liquid accumulates in the liquid reservoir when discharge of processing liquid from the peripheral portion discharge port is initiated. Since processing liquid can be discharged from the peripheral portion discharge port with the processing liquid accumulated in the liquid reservoir, discharge of the processing liquid from the peripheral portion discharge port can be accomplished in a satisfactory manner.

The processing liquid unit may further include a liquid reservoir that can accumulate the processing liquid discharged from the peripheral portion discharge port. In addition, the liquid reservoir may be situated above the peripheral portion discharge port, and the interior of the liquid reservoir and the peripheral portion discharge port may be connected via a connecting hole. Also, the construction may be such that processing liquid accumulated in the liquid reservoir is discharged from the peripheral portion discharge port via the connecting hole by reduction in pressure in the connecting hole, as fluid is distributed between the upper surface peripheral portion of the substrate and the surrounding region of the peripheral portion discharge port on the opposed surface. In this case, the substrate processing method may further include a spin drying step in which the substrate is subjected to high-speed rotation around a vertical rotational axis running through the center portion to cause drying by shaking off, without the processing liquid being accumulated in the liquid reservoir.

According to this method, the peripheral portion discharge port and the connecting hole are brought to reduced pressure as gas flows between the upper surface peripheral portion of the substrate and the part of the opposed surface surrounding the peripheral portion discharge port, when processing liquid is not accumulated in the liquid reservoir, or in other words, when gas is present inside the liquid reservoir. As a result the gas present inside the liquid reservoir is guided to the connecting hole by the Venturi effect, and discharged from the peripheral portion discharge port. The gas is thus discharged from the peripheral portion discharge port toward the upper surface peripheral portion of the substrate. Furthermore, since the gas is blown from the peripheral portion discharge port onto the peripheral portion of the upper surface of the substrate, the upper surface peripheral portion of the substrate can be satisfactorily dried. This allows the substrate drying performance to be increased.

The processing liquid may also include a chemical liquid.

The substrate processing method may also be a method for removal of a resist from the upper surface of the substrate. In this case, the chemical liquid may be ozone water that removes a resist from the substrate.

The aforementioned as well as other objects, features, and effects of the present invention will be made clear by the following description of the preferred embodiments, with reference to the accompanying drawings.

BRIEF DESCRIPTION OF THE DRAWINGS

FIG. 4 is a partial plan view of the opposed member included in the processing unit.

FIG. 5 is a partial bottom view of the opposed member.

FIG. 17 is a cross-sectional view serving for illustration of an arrangement example of a processing liquid discharge unit according to a fourth preferred embodiment of the present invention.

DETAILED DESCRIPTION OF THE PREFERRED EMBODIMENT

Figure 1:
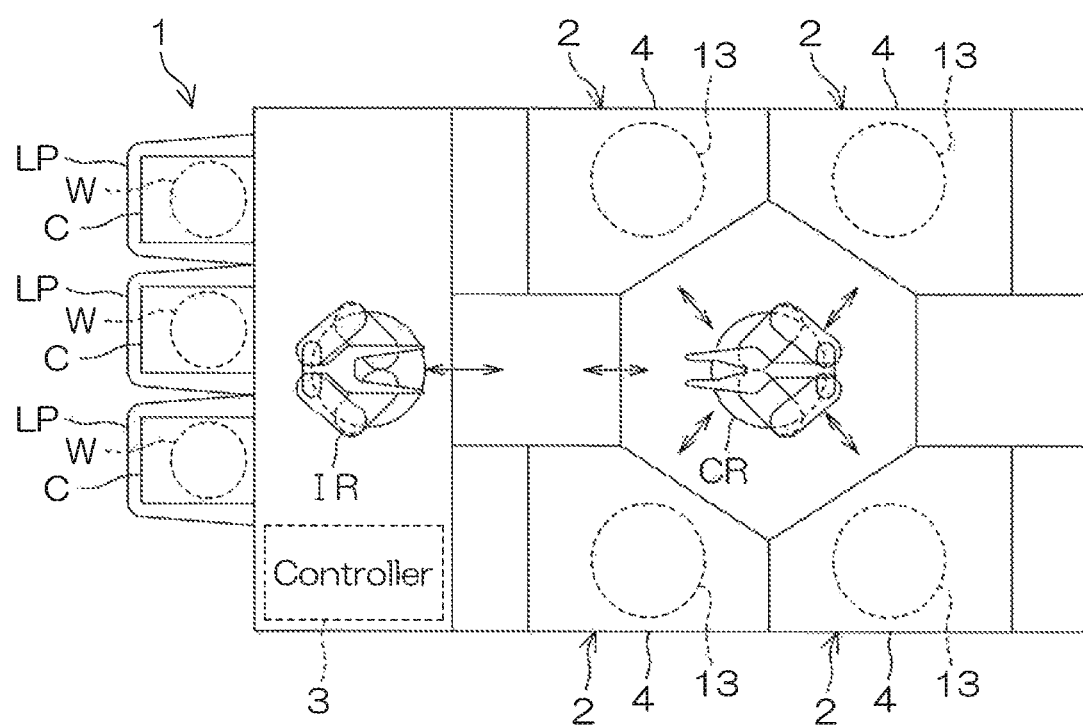
FIG. 1 is an illustrative plan view serving for illustration of the layout of the interior of a substrate processing apparatus according to a first preferred embodiment of the present invention.

FIG. 1 is an illustrative plan view serving for illustration of a layout of the interior of a substrate processing apparatus 1 according to a first preferred embodiment of the present invention. The substrate processing apparatus 1 is a single substrate processing type apparatus that conducts processing of a discoid substrate W such as a semiconductor wafer, one at a time using a processing liquid or processing gas. The substrate processing apparatus 1 includes a plurality of processing units 2 that are to process substrates W using a processing liquid, load ports LP mounting carriers C that house a plurality of substrates W to be processed by the processing units 2, transfer robots IR and CR that transport the substrates W between the load ports LP and the processing units 2, and a controller 3 that controls the substrate processing apparatus 1. The transfer robot IR transports the substrates W between the carriers C and the substrate transfer robot CR. The substrate transfer robot CR transports the substrates W between the transfer robot IR and the processing units 2. The plurality of processing units 2 may have the same construction, for example.

Figure 2:
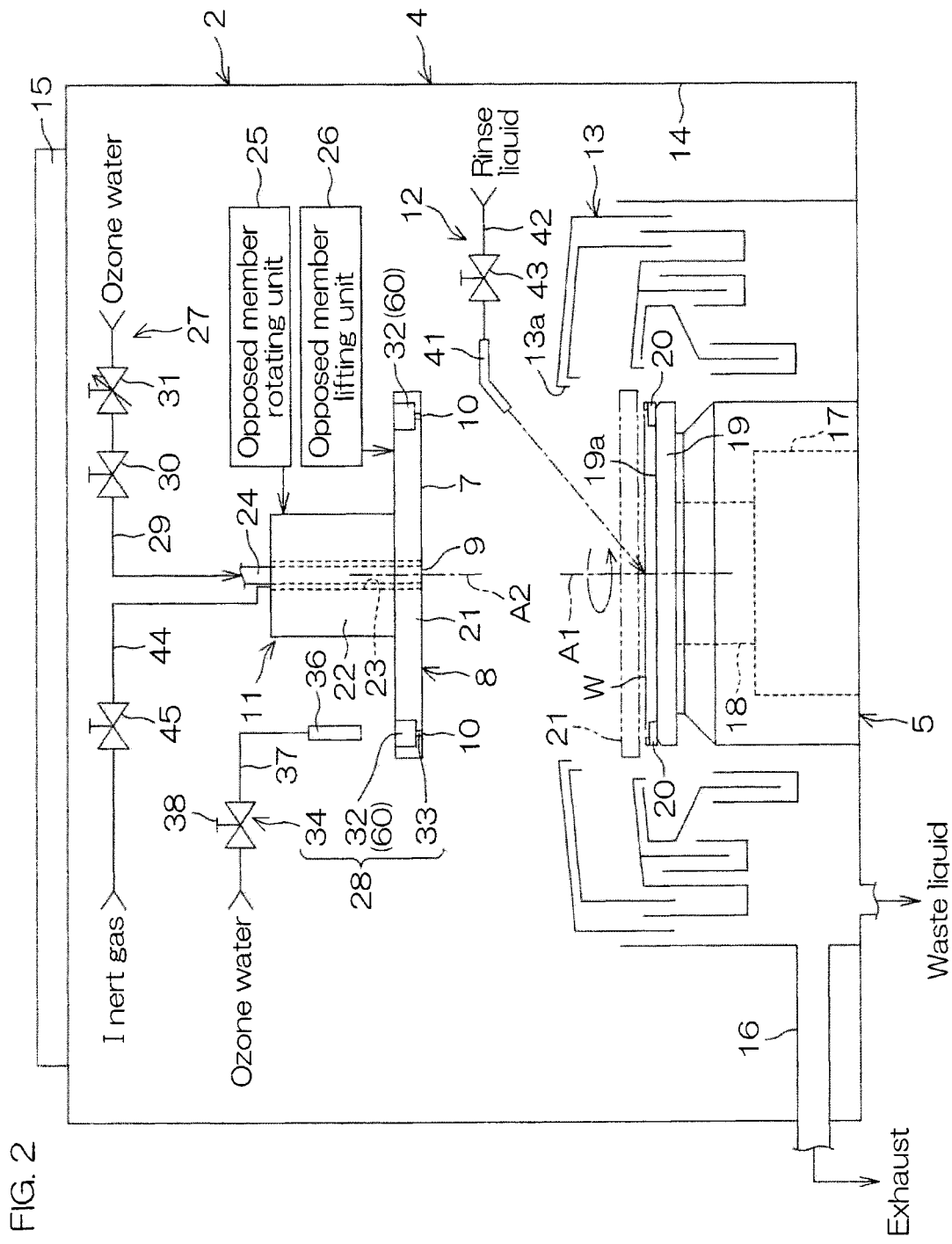
FIG. 2 is an illustrative cross-sectional view serving for illustration of an arrangement example of a processing unit included in the substrate processing apparatus.
Figure 3:
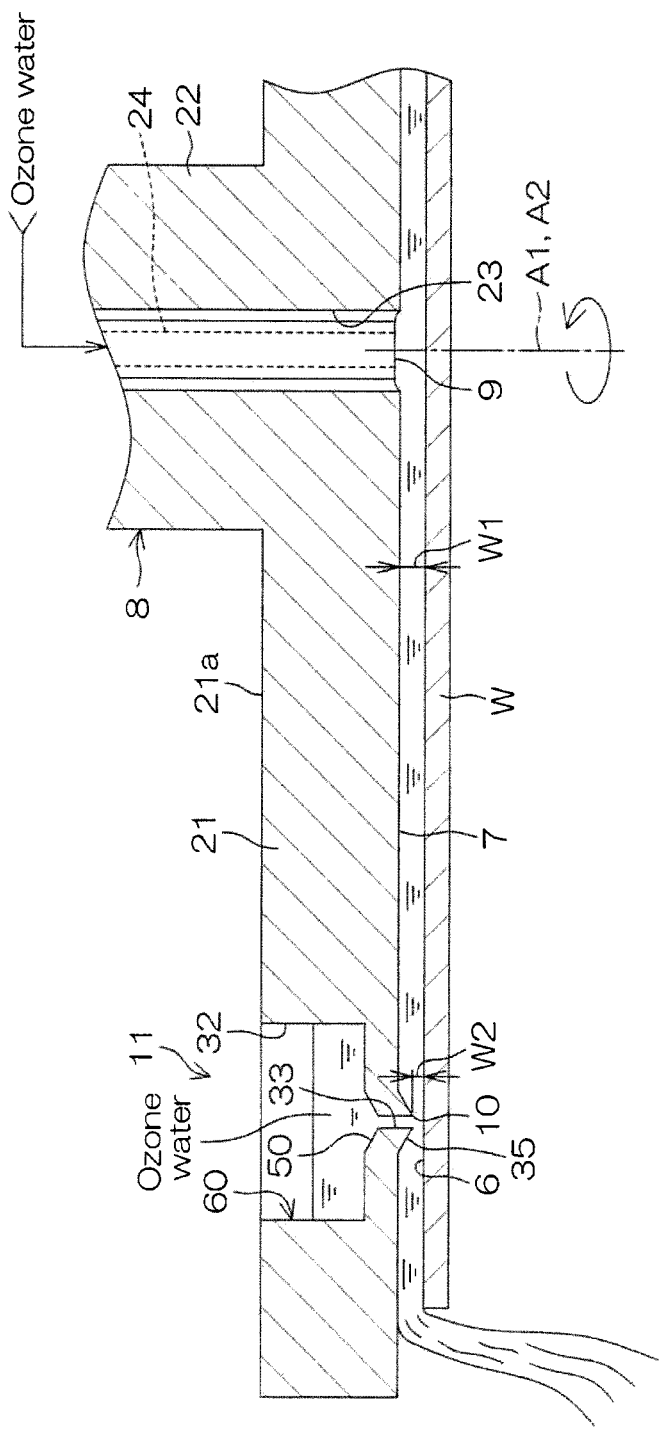
FIG. 3 is a cross-sectional view showing the state in which processing liquid is discharged from a peripheral portion discharge port shown in FIG. 2.
Figure 6:
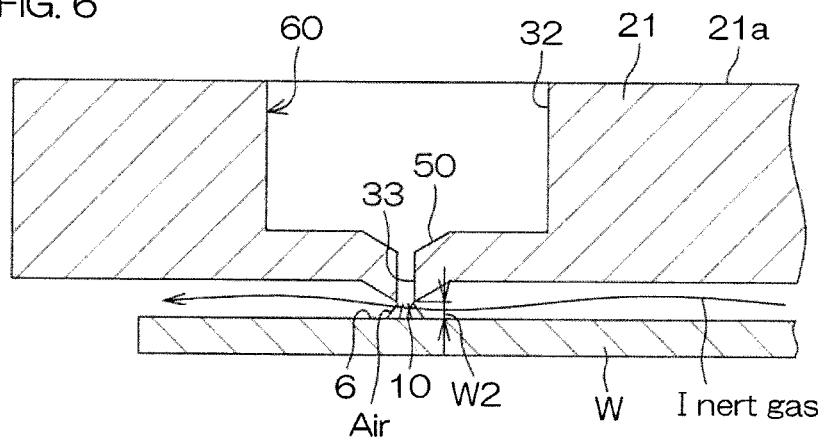
FIG. 6 is a cross-sectional view showing the state in which gas is discharged from a peripheral portion discharge port.

FIG. 2 is an illustrative cross-sectional view serving for illustration of an arrangement example of a processing unit 2. FIG. 3 is a cross-sectional view showing the state in which a chemical liquid (processing liquid) is discharged from a peripheral portion processing liquid discharge port 10. FIG. 4 is a partial plan view of an opposed member 8. FIG. 5 is a partial bottom view of the opposed member 8. FIG. 6 is a cross-sectional view showing the state in which gas is discharged from a peripheral portion processing liquid discharge port 10.

Each processing unit 2 includes a box-shaped chamber 4 with an interior space, a spin chuck (substrate holding unit) 5 that holds a single substrate W in the chamber 4 in a horizontal position and rotates the substrate W around a vertical rotational axis A1 running through the central of the substrate W, a first processing liquid discharge unit 11 including an opposed member 8, having an opposed surface 7 that is opposed to an upper surface of the substrate W held on the spin chuck 5, a central processing liquid discharge port 9 and peripheral portion processing liquid discharge ports (peripheral portion discharge ports) 10 that open at each opposed surface 7, that discharges a chemical liquid (processing liquid) from the central processing liquid discharge port 9 and the peripheral portion processing liquid discharge ports 10 onto the upper surface of the substrate W held on the spin chuck 5, a rinse liquid supply unit 12 for supplying rinse liquid to the upper surface of the substrate W held on the spin chuck 5, and a tubular processing cup 13 that surrounds the spin chuck 5.

The chamber 4 includes a box-shaped partition wall 14, an FFU (fan filter unit) 15 as a fan unit that delivers clean air from above the partition wall 14 to the partition wall 14 interior (corresponding to the chamber 4 interior), and an exhaust device (not shown) that discharges gas from below the partition wall 14 into the chamber 4.

The FFU 15 is disposed above the partition wall 14, and is mounted on the ceiling of the partition wall 14. The FFU 15 delivers clean air from the ceiling of the partition wall 14 into the chamber 4. The exhaust device (not shown) is connected to the bottom part of the processing cup 13 via an exhaust duct 16 connected to the processing cup 13 interior, and suctions the interior of the processing cup 13 from the bottom part of the processing cup 13. A downflow (downward flow) is formed inside the chamber 4 by the FFU 15 and the exhaust device (not shown).

The spin chuck 5 used is a clampable chuck that sandwiches the substrate W in the horizontal direction and holds the substrate W horizontally. Specifically, the spin chuck 5 includes a spin motor 17, a lower spin shaft 18 integrated with the drive shaft of the spin motor 17, and a discoid spin base 19 mounted essentially horizontally on the upper end of the lower spin shaft 18.

The spin base 19 includes a horizontal circular upper surface 19*a* having a larger outer diameter than the outer diameter of the substrate W. On the upper surface 19*a*, there are disposed a plurality (3 or more, such as 6) of clamping members 20, at the peripheral edge portion. The plurality of clamping members 20 are disposed at appropriate intervals, such as equal intervals, on the upper surface peripheral edge portion of the spin base 19, on the circumference corresponding to the peripheral portion shape of the substrate W.

The spin chuck 5 is not limited to a clampable type, and for example, it may be a vacuum adsorption type (vacuum chuck) wherein the substrate W is held in a horizontal position by vacuum adsorption from the rear surface of the substrate W, and rotated in that state around a vertical rotational axis, to rotate the substrate W held on the spin chuck 5.

The opposed member 8 includes a opposed plate 21, and an upper spin shaft 22 provided coaxially with the opposed plate 21. The opposed plate 21 has a discoid shape with a diameter that is approximately the same as or larger than the substrate W. The opposed surface 7 forms the lower surface of the opposed plate 21, and it is circular and being opposed to the entire region of the upper surface of the substrate W.

At the center portion of the opposed surface 7, there is formed a cylindrical through-hole 23 running vertically through the opposed plate 21 and the upper spin shaft 22. The inner peripheral wall of the through-hole 23 is partitioned by a cylindrical surface. A vertically extending upper nozzle 24 is inserted into (the interior of) the through-hole 23.

An opposed member rotating unit 25 is coupled with the upper spin shaft 22. The opposed member rotating unit 25 rotates the upper spin shaft 22 around the rotational axis A2 together with the opposed plate 21. An opposed member lifting unit 26 having a construction including an electric motor, ball screw, etc., is coupled to the opposed plate 21. The opposed member lifting unit 26 raises and lowers the opposed plate 21 in the vertical direction, together with the upper nozzle 24. The opposed member lifting unit 26 raises and lowers the opposed plate 21 and the upper nozzle 24, between a proximal position where the opposed surface 7 of the opposed plate 21 is proximal to the upper surface of the substrate W held on the spin chuck 5 (the position indicated by dot-and-dash lines in FIG. 2) and a retreat position provided above the proximal position (the position indicated by solid lines in FIG. 2). The opposed member lifting unit 26 can hold the opposed plate 21 at each position between the proximal position and the retreat position.

The first processing liquid discharge unit 11 includes the central processing liquid discharge port 9, a central processing liquid supply unit 27 for supplying processing liquid (for example, a chemical liquid) to the central processing liquid discharge port 9, the peripheral portion processing liquid discharge ports 10, and peripheral portion processing liquid supply units 28 for supplying a chemical liquid to the peripheral portion processing liquid discharge ports 10.

The central processing liquid discharge port 9 opens being opposed to the center portion of the upper surface of the substrate W held by the spin chuck 5. The central processing liquid discharge port 9 is formed by a discharge port provided on the tip (bottom end) of the upper nozzle 24.

The central processing liquid supply unit 27 includes the upper nozzle 24, a first processing liquid piping 29 connected to the central processing liquid discharge port 9, a first processing liquid valve 30 for opening and closing the first processing liquid piping 29, and a first flow control valve 31 for adjustment of the degree of opening of the first processing liquid piping 29 to adjust the discharge flow rate. While not shown here, the first flow control valve 31 includes a valve body with a valve seat provided inside it, a valve element that opens and closes the valve seat, and an actuator that moves the valve element between the open position and the closed position. The other flow control valves have a similar construction.

When the first processing liquid valve 30 is opened, the chemical liquid is discharged from the central processing liquid discharge port 9 toward the center portion of the upper surface of the substrate W. The discharge flow rate of the chemical liquid from the central processing liquid discharge port 9 can be varied by adjusting the degree of opening of the first flow control valve 31. The processing liquid supplied to the central processing liquid discharge port 9 includes a chemical liquid. For this preferred embodiment, the chemical liquid supplied to the central processing liquid discharge port 9 may be ozone water, for example (ozone water containing ozone gas at a high concentration, to be used for resist removal processing).

The peripheral portion processing liquid discharge ports 10 open being opposed to the upper surface peripheral portion 6 of the substrate W held by the spin chuck 5. Throughout the present specification, for example, the region with a width of approximately 75 mm inward from the peripheral edge of a substrate W with an outer diameter of 450 mm, on the upper surface of the substrate W, will be referred to as the "upper surface peripheral portion" 6.

For this preferred embodiment, a plurality of peripheral portion processing liquid discharge ports 10 are provided. A chemical liquid is discharged from each peripheral portion processing liquid discharge port 10 toward the upper surface peripheral portion 6 of the substrate W. The plurality of peripheral portion processing liquid discharge ports 10 are disposed on the circumference surrounding the rotational axis A2 in a concentric manner. The plurality of peripheral portion processing liquid discharge ports 10 are disposed in the circumferential direction of the opposed member 8, with equal intervals between them, for example.

Each peripheral portion processing liquid supply unit 28 includes a liquid reservoir 60 capable of accumulating a chemical liquid.

The liquid reservoir 60 includes a liquid reservoir groove 32 formed on the upper surface (the surface on the side opposite the opposed surface 7) 21a of the opposed plate 21. Each peripheral portion processing liquid supply unit 28 further includes a connecting hole 33 that connects the bottom part of the liquid reservoir groove 32 and the peripheral portion processing liquid discharge port 10, and a first processing liquid supply unit 34 that supplies (replenishes) the chemical liquid to the liquid reservoir groove 32. The connecting hole 33 is formed with a sufficiently smaller diameter than the base area of the liquid reservoir groove 32.

As shown in FIG. 3 and FIG. 4, the liquid reservoir groove 32 is a circular annular groove centered on the rotational axis A2, designed to allow accumulation of the chemical liquid in its interior. The liquid reservoir groove 32 is provided on the peripheral portion of the opposed member 8. For this preferred embodiment, the liquid reservoir groove 32 is disposed in a manner covering the upper region of each peripheral portion processing liquid discharge port 10. The liquid reservoir groove 32 has a rectangular cross-section.

As shown in FIG. 3 and FIG. 4, one connecting hole 33 is provided for each peripheral portion processing liquid discharge port 10. The cross-sectional shapes and sizes of the connecting holes 33 are equal to those of the peripheral portion processing liquid discharge ports 10. In other words, each connecting hole 33 opens to the opposed surface 7, forming a peripheral portion processing liquid discharge port 10. A tapered surface 50 is formed at the region of the bottom part of the liquid reservoir groove 32 surrounding the connecting hole 33, centered around the connecting hole 33. The upper end of the connecting hole 33 is open at the lowermost part (center portion) of the tapered surface 50.

The cross-sectional area of the connecting hole 33 is formed with a small enough size so that the chemical liquid is not supplied to the peripheral portion processing liquid discharge port 10 when the fluid is not flowing between the upper surface peripheral portion 6 of the substrate W and the opposed surface 7. Force acts on the chemical liquid accumulated in the liquid reservoir groove 32 toward the peripheral portion processing liquid discharge port 10 formed at the bottom part of the liquid reservoir groove 32, by the weight of the chemical liquid itself. However, since the cross-sectional area of the connecting hole 33 is sufficiently small, the chemical liquid does not infiltrate through the connecting hole 33 due to the surface tension of the chemical liquid.

As shown in FIG. 3, a protrusion 35 is formed in the opposed surface 7, at a position being opposed to the center portion of the upper surface of the substrate W held by the spin chuck 5. The protrusion 35 forms a circular annular shape surrounding the rotational axis A2 in a concentric manner. The cross-sectional shape of the protrusion 35, perpendicular to the circumferential direction of the opposed member, is approximately triangular conic. The peripheral portion processing liquid discharge port 10 is formed on the bottom end (tip) of the protrusion 35.

As shown in FIG. 3, the peripheral portion processing liquid discharge port 10 and connecting hole 33 are brought to reduced pressure as fluid (chemical liquid (processing liquid), according to the first preferred embodiment and second preferred embodiment) flows between the upper surface peripheral portion 6 of the substrate W and the opposed surface 7. As shown in FIG. 3, with the chemical liquid accumulated in the liquid reservoir groove 32, reduced pressure in the peripheral portion processing liquid discharge port 10 and the connecting hole 33 causes the chemical liquid accumulated in the liquid reservoir groove 32 to be guided to the connecting hole 33 by the Venturi effect, and discharged from the peripheral portion processing liquid discharge port 10. That is, by accumulating a sufficient amount of chemical liquid in the liquid reservoir groove 32, it is possible to discharge the chemical liquid from the peripheral portion processing liquid discharge port 10 together with distribution of the chemical liquid that has been discharged from the central processing liquid discharge port 9, between the upper surface peripheral portion 6 of the substrate W and the opposed surface 7.

Since the cross-sectional area of the connecting hole 33 is sufficiently small for this preferred embodiment, the chemical liquid begins to be discharged from the peripheral portion processing liquid discharge port 10 only by the Venturi effect when the chemical liquid is distributed between the upper surface peripheral portion of the substrate W and the opposed surface 7. Since the chemical liquid is not discharged from the peripheral portion processing liquid discharge port 10 when the chemical liquid is not flowing between the upper surface peripheral portion 6 of the substrate and the opposed surface 7, the chemical liquid can be accumulated in the liquid reservoir groove 32 prior to the timing of discharge through the peripheral portion processing liquid discharge port 10, thereby allowing undesired dripping of liquid to be prevented.

Moreover, providing the protrusion 35 on the opposed surface 7 can increase the flow rate of chemical liquid flowing between the upper surface peripheral portion 6 of the substrate W and the surrounding of the peripheral portion processing liquid discharge port 10 on the opposed surface 7. It will thus be possible to increase the volume of chemical liquid guided from the liquid reservoir groove 32 to the peripheral portion processing liquid discharge port 10 via the connecting hole. As a result, it will be possible to discharge chemical liquid at a sufficient flow rate from the peripheral portion processing liquid discharge port 10.

On the other hand, as shown in FIG. 6, when gas (for example, inert gas) flows between the upper surface peripheral portion 6 of the substrate W and the opposed surface 7 without chemical liquid accumulated in the liquid reservoir groove 32, i.e. with air present inside the liquid reservoir groove 32, the pressure is concomitantly reduced in the peripheral portion processing liquid discharge port 10 and the connecting hole 33. When the pressure in the peripheral portion processing liquid discharge port 10 and the connecting hole 33 is reduced, air present inside the liquid reservoir groove 32 is guided to the connecting hole 33 by the Venturi effect, and discharged from the peripheral portion processing liquid discharge port 10.

As shown in FIG. 2, the first processing liquid supply unit 34 includes a replenishing nozzle 36, a second processing liquid piping 37 connected to the replenishing nozzle 36, and a second processing liquid valve 38 interposed in the second processing liquid piping 37. The replenishing nozzle 36 orients its discharge port toward the liquid reservoir groove 32. When the second processing liquid valve 38 is opened, the chemical liquid is discharged from the replenishing nozzle 36 toward the liquid reservoir groove 32. The chemical liquid supplied to the liquid reservoir groove 32 accumulates in the liquid reservoir groove 32. The chemical liquid accumulated in the liquid reservoir groove 32 is, for example, ozone water (ozone water containing a high concentration of ozone gas to be used for resist removal processing).

The rinse liquid supply unit 12 includes a rinse liquid nozzle 41. The rinse liquid nozzle 41 is, for example, a straight nozzle that discharges liquid in a continuous flowing state, and it is disposed in a fixed manner above the spin chuck 5, with its discharge port oriented to the center portion of the upper surface of the substrate W. A rinse liquid piping 42 through which rinse liquid is supplied from a rinse liquid supply source is connected to the rinse liquid nozzle 41. Partway along the rinse liquid piping 42 there is interposed a rinse liquid valve 43 for switching to halt discharge/supply of the rinse liquid from the rinse liquid nozzle 41. When the rinse liquid valve 43 is opened, a continuous flow of rinse liquid supplied from the rinse liquid piping 42 to the rinse liquid nozzle 41 is discharged from the discharge port set at the bottom end of the rinse liquid nozzle 41. When the rinse liquid valve 43 is closed, discharge of the rinse liquid from the rinse liquid piping 42 to the rinse liquid nozzle 41 is halted. The rinse liquid is deionized water (DIW), for example, but is not limited to DIW and may instead be carbonated water, electrolytic ion water, hydrogen water or diluted (for example, about 10 ppm to 100 ppm) hydrochloric acid water.

Also, each rinse liquid nozzle 41 does not need to be disposed in a fixed manner with respect to the spin chuck 5, and for example, it may be in the form of a scan nozzle mounted on a swingable arm within a horizontal plane above the spin chuck 5, whereby the liquid landing position of the rinse liquid on the upper surface of the substrate W is scanned by swinging of the arm.

As shown in FIG. 2, the processing unit 2 includes a first inert gas pipe 44 that supplies an inert gas into the tubular space between the peripheral portion of the main body of the upper nozzle 24 and the inner periphery of the opposed plate 21 (the peripheral portion of the through-hole 23), and a first inert gas valve 45 interposed within the first inert gas pipe 44. When the first inert gas valve 45 is opened, the inert gas from the inert gas supply source is discharged downward from the lower surface center portion of the opposed plate 21, through the region between the peripheral portion of the main body of the upper nozzle 24 and the inner periphery of the opposed plate 21. Thus, when the first inert gas valve 45 is opened with the opposed plate 21 disposed at the proximal position, the inert gas discharged from the lower surface center portion of the opposed plate 21 spreads downward between the upper surface of the substrate W and the opposed surface 7 of the opposed plate 21 (in a direction away from the rotational axis A1), and the air between the substrate W and the opposed plate 21 is exchanged with the inert gas. The inert gas flowing in the first inert gas pipe 44 is nitrogen gas, for example. The inert gas is not limited to nitrogen gas, and may instead be a different inert gas such as helium gas or argon gas.

As shown in FIG. 2, the processing cup 13 is disposed further downward than the substrate W that is held by the spin chuck 5 (in a direction away from the rotational axis A1). The processing cup 13 surrounds the spin base 19. When processing liquid (ozone water droplets, water droplets, chemical liquid or rinse liquid) is supplied to the substrate W while the spin chuck 5 is rotating the substrate W, the processing liquid supplied to the substrate W is shaken off to the surrounding area of the substrate W. During the time when the processing liquid is supplied to the substrate W, the top edge 13a of the processing cup 13 that has been opened upward is disposed higher than the spin base 19. Thus, the processing liquid that has been discharged to the surrounding area of the substrate W is received by the processing cup 13. The processing liquid received into the processing cup 13 is then delivered to a collecting apparatus or waste liquid apparatus (not shown).

Figure 7:
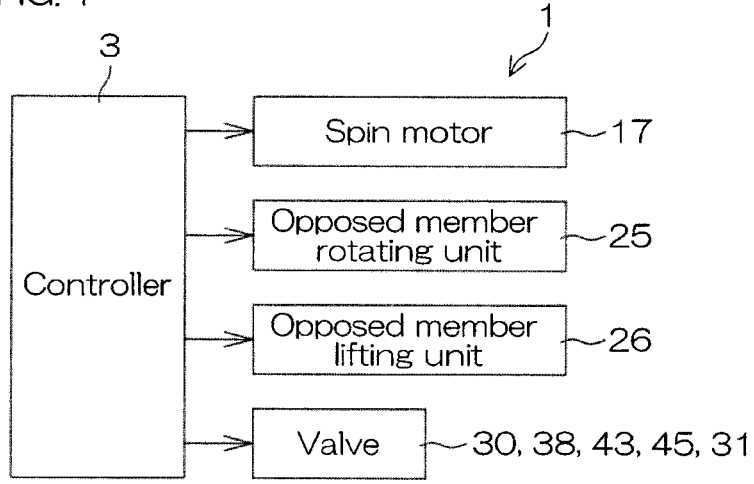
FIG. 7 is a block diagram serving for illustration of the electrical configuration of the main part of the substrate processing apparatus.

FIG. 7 is a block diagram serving for illustration of the electrical configuration of the main part of a substrate processing apparatus 1.

The controller 3 is constructed using, for example, a microcomputer. The controller 3 has a computing unit such as a CPU, a memory unit such as a fixed memory device or hard disk drive, and an input/output unit. A program executed by the computing unit is stored in the memory unit.

The controller 3 controls operation of the spin motor 17, opposed member rotating unit 25 and opposed member lifting unit 26, etc., according to a predetermined program. The controller 3 also controls opening and closing the first processing liquid valve 30, the second processing liquid valve 38, the rinse liquid valve 43 and the first inert gas valve 45, etc. The controller 3 also adjusts the degree of opening of the first flow control valve 31.

Figure 8:
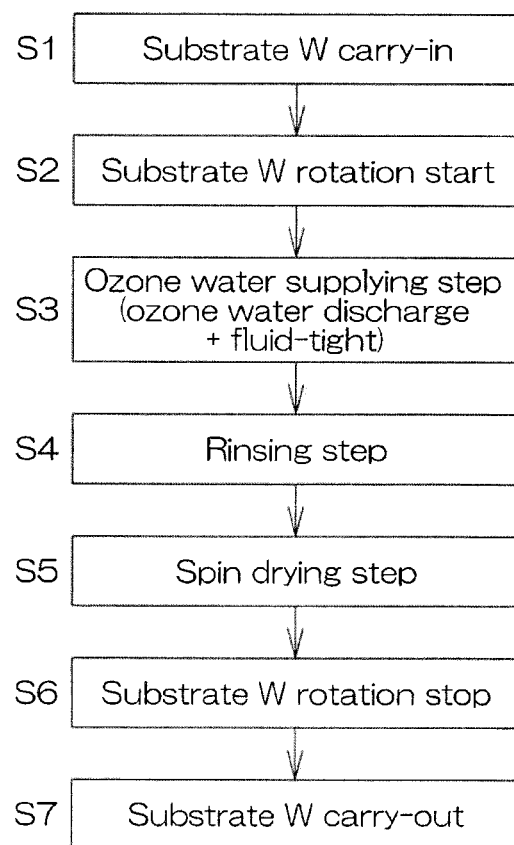
FIG. 8 is a flow diagram serving for illustration of an example of substrate processing performed by the processing unit.

FIG. 8 is a flow diagram serving for illustration of an example of resist removal processing carried out by the processing unit 2.

The example of resist removal processing will now be explained with reference to FIG. 2, FIG. 3 and FIG. 6 to FIG. 8.

When resist removal processing of a substrate W is to be carried out by the processing unit 2, a high-dose ion-implanted substrate W is imported into the chamber 4 (step S1). The imported substrate W is one that has not undergone processing for ashing the resist (photoresist). That is, a pattern is formed on the front surface of the substrate W, and a resist made of a photosensitive resin or the like is formed so as to cover all or a part of the pattern.

Specifically, the controller 3 causes the hand of a substrate transfer robot CR (see FIG. 1) holding the substrate W to enter into the chamber 4, with the opposed member 8 disposed at the retreat position and without ozone water having been accumulated in the liquid reservoir groove 32, such that the substrate W is transferred to the spin chuck 5 with its front surface (pattern-formed surface) oriented upward. The substrate W thus becomes held by the spin chuck 5.

Next, the controller 3 initiates rotation of the substrate W by the spin motor 17 (step S2). The substrate W is accelerated to a predetermined liquid processing speed (for example, about 800 rpm), which is raised, after which the liquid processing speed is maintained.

Next, an ozone water supplying step (step S3) is carried out wherein ozone water is supplied to the upper surface of the substrate W, to release the resist from the substrate W. Specifically, the controller 3 controls the opposed member lifting unit 26 to position the opposed plate 21 at the first proximal position (the position indicated by the dot-and-dash line in FIG. 2). When the opposed plate 21 is at the first proximal position, the interval W1 between the upper surface of the substrate W and the opposed surface 7 of the opposed plate 21 is approximately 1 mm (the interval W2 between the upper surface of the substrate W and the lowermost part of the protrusion 35 is approximately 0.3 mm), and in that state, the opposed plate 21 shields the upper surface of the substrate W from its surrounding space.

After the opposed plate 21 has been disposed at the first proximal position, the controller 3 controls the opposed member rotating unit 25 to rotate the opposed plate 21 around the rotational axis A2. During this time, for example, the rotational direction of the opposed plate 21 is the same direction as the rotational direction of the substrate W, and the rotational speed of the opposed plate 21 is also approximately 800 rpm, or the same as for rotation of the substrate W.

After the opposed plate 21 has been disposed at the first proximal position, the controller 3 again opens the first processing liquid valve 30. By opening of the first processing liquid valve 30, ozone water is discharged from the central processing liquid discharge port 9 toward the center portion of the upper surface of the substrate W (processing liquid discharging step). The ozone water discharged from the central processing liquid discharge port 9 is subjected to centrifugal force by rotation of the substrate W, and flows toward the radially outer side, between the substrate W and the opposed surface 7 of the opposed member 8.

After the opposed plate 21 has been disposed at the first proximal position, the controller 3 also opens the second processing liquid valve 38. By opening of the second processing liquid valve 38, ozone water is discharged from the replenishing nozzle 36 toward the liquid reservoir groove 32 (processing liquid supplying step). The ozone water supplied to the liquid reservoir groove 32 accumulates in the liquid reservoir groove 32.

The ozone water flowing toward the radially outer side between the upper surface peripheral portion 6 of the substrate W and the opposed surface 7 reaches the top of the upper surface peripheral portion 6 of the substrate W. During this time, as the ozone water flows between the upper surface peripheral portion 6 of the substrate W and the part of the opposed surface 7 surrounding the peripheral portion processing liquid discharge port 10, the pressure is reduced in the peripheral portion processing liquid discharge port 10 and the connecting hole 33, and the ozone water accumulated in the liquid reservoir groove 32 is guided to the connecting hole 33 by the Venturi effect and discharged from the peripheral portion processing liquid discharge port 10. As a result, ozone water is discharged from each peripheral portion processing liquid discharge port 10 toward the upper surface peripheral portion 6 of the substrate W (processing liquid discharging step). The region between the substrate W and the opposed surface 7 is filled not only by ozone water discharged from the central processing liquid discharge port 9, but also by ozone water discharged from the peripheral portion processing liquid discharge port 10. This state (fluid-tight state) is maintained from that point onward.

Thus, resist removal processing is carried out with the ozone water on the upper surface of the substrate W, while the substrate W and the opposed member 8 are each rotated, and the entire region between the substrate W and the opposed surface 7 is kept in a fluid-tight state for the ozone water. This results in removal of the resist from the upper surface of the substrate W.

When the predetermined period from opening of the first processing liquid valve 30 has elapsed, the controller 3 closes the first processing liquid valve 30 to complete the ozone water supplying step S3. Next, the controller 3 controls the opposed member lifting unit 26 to retreat the opposed plate 21 to the retreat position (the position indicated by solid lines in FIG. 2).

A rinsing step (step S4) is then carried out in which a rinse liquid is supplied to the substrate W. Specifically, the controller 3 opens the rinse liquid valve 43 to discharge the rinse liquid from the rinse liquid nozzle 41 toward the center portion of the upper surface of the substrate W. The rinse liquid that has been discharged from the rinse liquid nozzle 41 lands on the center portion of the upper surface of the substrate W. The rinse liquid that has landed on the center portion of the upper surface of the substrate W is subjected to centrifugal force by rotation of the substrate W and flows onto the upper surface of the substrate W toward the peripheral edge portion of the substrate W. This causes the ozone water on the substrate W to be pushed to flow outward by the rinse liquid, and discharged to the surrounding area of the substrate W. As a result, the ozone water and the removed resist are washed out throughout the entire region of the upper surface of the substrate W. When the predetermined period from the start of the rinsing step S4 has elapsed, the controller 3 closes the rinse liquid valve 43 to stop discharge of the rinse liquid from the rinse liquid nozzle 41.

A spin drying step (step S5) is then carried out, in which the substrate W is dried. Specifically, the controller 3 controls the opposed member lifting unit 26 to position the opposed plate 21 at the first proximal position (the position indicated by the dot-and-dash line in FIG. 2).

The controller 3 also controls the spin motor 17 to accelerate the substrate W to a drying rotational speed (a high rotational speed, such as several thousand rpm) that is higher than the rotational speed in the ozone water supplying step S3 and the rinsing step S4, and rotation of the substrate W is continued at the drying rotational speed. This causes large centrifugal force to be applied to the liquid on the substrate W, such that the liquid adhering to the substrate W is shaken off to the surrounding area of the substrate W. Thus, the liquid is removed from the substrate W and the substrate W becomes dried. In addition, the controller 3 controls the opposed member rotating unit 25 to rotate the opposed plate 21 in the rotational direction of the substrate W at approximately the same speed.

Moreover, in the spin drying step S5, the controller 3 opens the first inert gas valve 45 and supplies an inert gas into the tubular space between the peripheral portion of the main body of the upper nozzle 24 and the inner periphery of the opposed plate 21 (the peripheral portion of the through-hole 23). The inert gas supplied into the tubular space is discharged downward from the lower surface center portion of the opposed plate 21, and flows toward the radially outer side (the direction away from the rotational axis A1), between the upper surface of the substrate W and the opposed surface 7 of the opposed plate 21. As a result, a stable flow of inert gas is produced in the gap between the upper surface of the substrate W and the opposed surface 7 of the opposed plate 21, from the center portion of the substrate W toward the peripheral edge portion, and the atmosphere near the upper surface of the substrate W is shielded from its surrounding area. In this state, the ozone water (processing water) does not accumulate in the liquid reservoir groove 32.

While in this state, i.e. the state in which air is present inside the liquid reservoir groove 32, as the inert gas flows between the upper surface peripheral portion 6 of the substrate W and the part of the opposed surface 7 surrounding the peripheral portion processing liquid discharge port 10, the pressure is reduced in the peripheral portion processing liquid discharge port 10 and the connecting hole 33, and the air present inside the liquid reservoir groove 32 is guided to the connecting hole 33 by the Venturi effect and discharged from the peripheral portion processing liquid discharge port 10. As a result, the air is discharged from each peripheral portion processing liquid discharge port 10 toward the upper surface peripheral portion 6 of the substrate W. Furthermore, since the air is blown from the peripheral portion processing liquid discharge port 10 to the upper surface peripheral portion 6 of the substrate W, in addition to blowing of the inert gas from the lower surface center portion of the opposed plate 21, the upper surface peripheral portion 6 of the substrate can be satisfactorily dried. This allows the drying performance for the substrate W in the spin drying step S5 to be increased.

Moreover, when the prescribed time has elapsed from the start of high-speed rotation of the substrate W, the controller 3 controls the spin motor 17 to stop rotation of the substrate W by the spin chuck 5 (step S6). Next, the controller 3 controls the opposed member lifting unit 26 to retreat the opposed plate 21 to the retreat position (the position indicated by the solid line in FIG. 2).

The substrate W is then carried outward from the chamber 4 (step S7). Specifically, the controller 3 causes the hand of the substrate transfer robot CR to enter into the chamber 4. The controller 3 also holds the substrate W that is on the spin chuck 5 in the hand of the substrate transfer robot CR. Next, the controller 3 causes the hand of the substrate transfer robot CR to retreat from inside the chamber 4. This causes the substrate W with the resist removed from its front surface to be carried outward from the chamber 4.

Moreover, in the processing example shown in FIG. 8, a hydrogen peroxide water supplying step, in which hydrogen peroxide water ($H_2O_2$) is supplied to the upper surface of the substrate W (front surface), may be carried out before carrying out the ozone water supplying step S3 or after carrying out the ozone water supplying step S3.

Furthermore, in the processing example shown in FIG. 8, after completion of the rinsing step S4, there may be carried out a washing chemical liquid supplying step in which a washing chemical liquid is supplied to the upper surface of the substrate W to remove resist residue from the upper surface of the substrate W. When a washing chemical liquid supplying step is carried out, it may be followed by another second rinsing step in which the chemical liquid on the upper surface of the substrate W is washed off with a rinse liquid.

According to the first preferred embodiment as described above, the region between the substrate W and the opposed surface 7 is filled not only by chemical liquid (ozone water) discharged from the central processing liquid discharge port 9, but also by chemical liquid discharged from the peripheral portion processing liquid discharge port 10. Since discharge of the chemical liquid from the peripheral portion processing liquid discharge port 10 replenishes the chemical liquid between the upper surface peripheral portion 6 of the substrate W and the opposed surface 7, the chemical liquid can be adequately spread over the upper surface peripheral portion 6 of the substrate W. It is thereby possible to satisfactorily fill not only the region between the center portion of the upper surface of the substrate W and the opposed surface 7 but also the region between the upper surface peripheral portion 6 of the substrate W and the opposed surface 7 with the chemical liquid, and thus to carryout resist removal processing evenly over the upper surface of the substrate W.

Furthermore, the peripheral portion processing liquid discharge port 10 and the connecting hole 33 are brought to reduced pressure as the processing liquid flows between the upper surface peripheral portion 6 of the substrate W and the opposed surface 7. In a state with the processing liquid accumulated in the liquid reservoir groove 32, reduced pressure in the peripheral portion processing liquid discharge port 10 and the connecting hole 33 causes the chemical liquid accumulated in the liquid reservoir groove 32 to be guided to the connecting hole 33 by the Venturi effect, and discharged from the peripheral portion processing liquid discharge port 10. By accumulating the chemical liquid in the liquid reservoir 60, the chemical liquid is discharged from the peripheral portion processing liquid discharge port 10 during distribution of the chemical liquid that has been discharged from the central processing liquid discharge port 9, between the upper surface peripheral portion 6 of the substrate W and the opposed surface 7. This allows the chemical liquid to be discharged from the peripheral portion processing liquid discharge port 10 without chemical liquid being delivered (pressure-fed) out through the peripheral portion processing liquid discharge port 10, thereby making it possible to eliminate any arrangement for delivering out the chemical liquid through the peripheral portion processing liquid discharge port 10.

Figure 9:
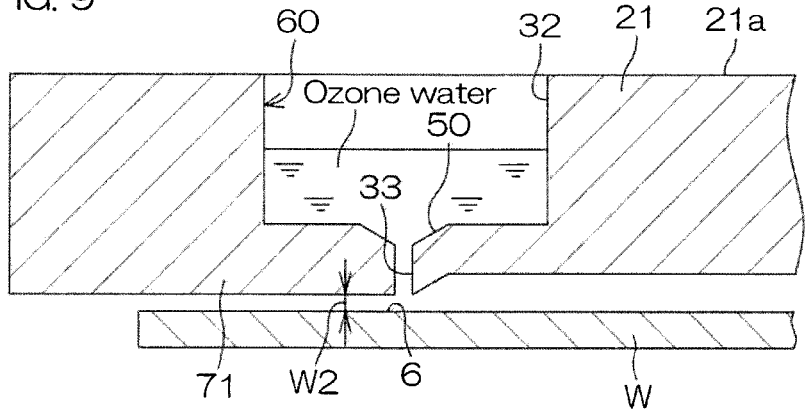
FIG. 9 is a cross-sectional view showing a first modification example of a liquid reservoir groove.

Furthermore, as shown in FIG. 9, instead of the arrangement where protrusions 35 are provided in the opposed surface 7, a circular annular thick portion 71 may be formed in the opposed surface 7, further outside in the circumferential direction of the opposed plate 21 than the peripheral portion processing liquid discharge port 10, to increase the flow rate of the chemical liquid flowing between the upper surface peripheral portion 6 of the substrate W and the part of the opposed surface 7 surrounding the peripheral portion processing liquid discharge port 10.

Figure 10:
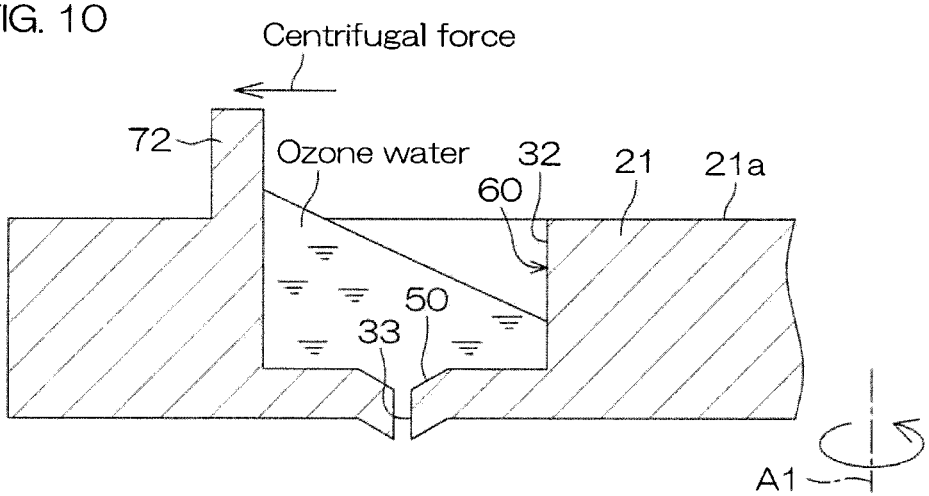
FIG. 10 is a cross-sectional view showing a second modification example of a liquid reservoir groove.

Also, as shown in FIG. 10, an embankment 72 may formed in the opposed plate 21, restricting outflow of the chemical liquid accumulated in the liquid reservoir groove 32 from the liquid reservoir groove 32. The embankment 72 is formed so as to rise from the upper surface of the opposed plate 21, upward along the outer peripheral surface of the liquid reservoir groove 32. The embankment 72 has a circular annular shape surrounding the peripheral portion of the liquid reservoir groove 32. In the substrate processing example described above, in the ozone water supplying step S3, the opposed plate 21 is rotated at high speed around the rotational axis A1, and therefore large centrifugal force acts on the chemical liquid accumulated in the liquid reservoir groove 32, but by providing an embankment 72 on the peripheral portion side of the liquid reservoir groove 32, it is possible to effectively restrict outflow of the chemical liquid from the liquid reservoir 60 in the ozone water supplying step S3. This allows the chemical liquid inside the liquid reservoir groove 32 to be satisfactorily accumulated.

Figure 11:
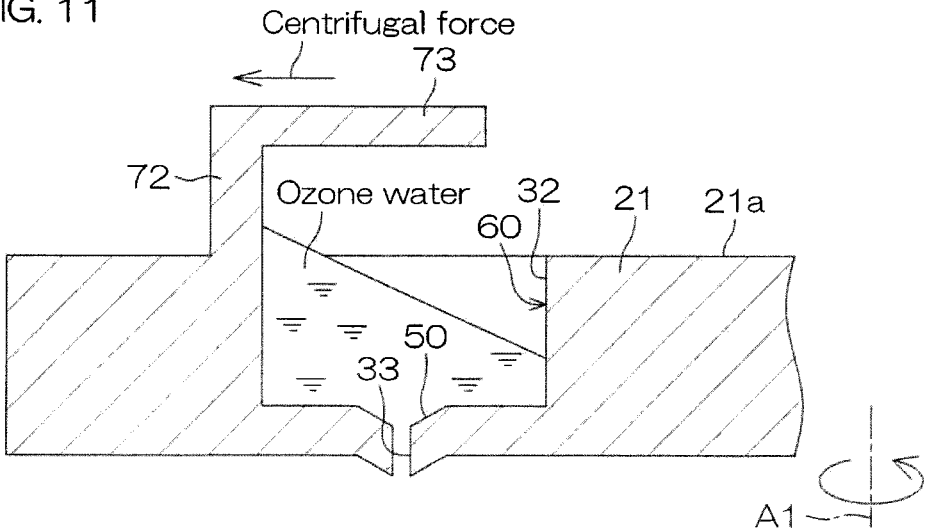
FIG. 11 is a cross-sectional view showing a third modification example of a liquid reservoir groove.

When an embankment 72 is provided on the peripheral portion side of the liquid reservoir groove 32, there may be further provided a hood portion 73 that protrudes from the top edge of the embankment 72, toward the radially inner side of the opposed plate 21, as shown in FIG. 11. The hood portion 73 has a discoid shape, for example. The embankment 72 and hood portion 73 may also be provided in an integral manner. In this case, the hood portion 73 will be able to even more effectively restrict outflow of the chemical liquid from the liquid reservoir groove 32. This will allow the chemical liquid in the liquid reservoir 60 to be even more satisfactorily accumulated.

Figure 12:
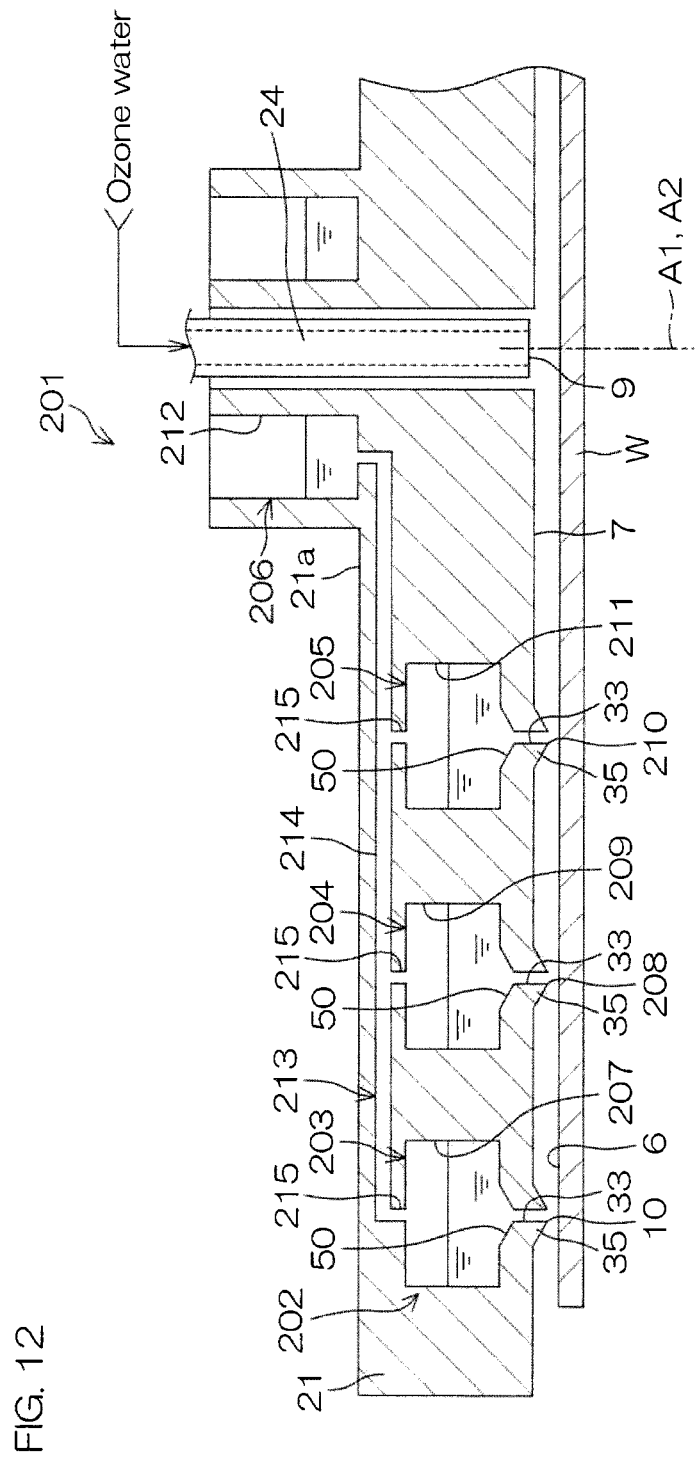
FIG. 12 is a cross-sectional view serving for illustration of an arrangement example of a processing liquid discharge unit according to a second preferred embodiment of the present invention.

FIG. 12 is a cross-sectional view serving for illustration of an arrangement example of a first processing liquid discharge unit 11 according to a second preferred embodiment of the present invention.

For the second preferred embodiment, the parts corresponding to each part indicated for the first preferred embodiment will be denoted by the same reference numerals as in FIG. 1 to FIG. 11 and will not be explained again.

The substrate processing apparatus 201 of the second preferred embodiment differs from the substrate processing apparatus 1 of the first preferred embodiment in that the liquid reservoir included in the second processing liquid discharge unit 202 is not a liquid reservoir groove 32, but rather includes liquid reservoir spaces formed inside the opposed member 8 (first liquid reservoir space 207, second liquid reservoir space 209 and third liquid reservoir space 211). It also differs from the first processing liquid discharge unit 11 in that two sets of liquid reservoir discharge units composed of a discharge port, a liquid reservoir and a connecting hole are provided, not only on the peripheral portion of the opposed member 8 but also at the intermediate part of the opposed member 8 (the part between the center portion of the opposed member 8 and the peripheral portion of the opposed member 8).

In other words, the second processing liquid discharge unit 202 includes a first liquid reservoir discharge unit 203, a second liquid reservoir discharge unit 204 and a third liquid reservoir discharge unit 205, and a second processing liquid supply unit 206 that supplies chemical liquid (processing liquid) to the first to third liquid reservoir discharge units 203 to 205.

The first liquid reservoir discharge unit 203 includes a peripheral portion processing liquid discharge port 10, a first liquid reservoir space 207 and a connecting hole 33. The first liquid reservoir space 207 is a space having a circular annular shape centered around the rotational axis A2. The chemical liquid can be accumulated in the first liquid reservoir space 207. The first liquid reservoir space 207 is a space having a circular annular shape centered around the rotational axis A2, that can accumulate the chemical liquid. For this preferred embodiment, the first liquid reservoir space 207 is disposed in a manner covering the upper region of each peripheral portion processing liquid discharge port 10. The first liquid reservoir space 207 has a rectangular cross-section.

The second liquid reservoir discharge unit 204 includes a first intermediate part discharge port 208, a second liquid reservoir space 209 and a connecting hole 33. The first intermediate part discharge port 208 opens being opposed to the first upper surface intermediate part of the substrate W that is held by the spin chuck 5 (the part between the center portion of the upper surface and the upper surface peripheral portion 6). For this preferred embodiment, a plurality of first intermediate part discharge ports 208 are disposed on the circumference surrounding the rotational axis A2 in a concentric manner. The plurality of first intermediate part discharge ports 208 are disposed in the circumferential direction of the opposed member 8, with equal intervals between them, for example. The second liquid reservoir space 209 is a space having a circular annular shape centered around the rotational axis A2, on the inner side of the first liquid reservoir space 207. The chemical liquid can be accumulated in the second liquid reservoir space 209.

The cross-sectional area of the connecting hole 33 is formed with a small enough size so that the chemical liquid is not supplied to the first intermediate part discharge port 208 when the fluid is not flowing between the upper surface peripheral portion 6 of the substrate W and the opposed surface 7. Force acts on the chemical liquid accumulated in the second liquid reservoir space 209 toward the first intermediate part discharge port 208 formed at the bottom part of the liquid reservoir groove 32, by the weight of the chemical liquid itself. However, since the cross-sectional area of the connecting hole is sufficiently small, the chemical liquid does not infiltrate the connecting hole 33 due to the surface tension of the chemical liquid.

The third liquid reservoir discharge unit 205 includes a second intermediate part discharge port 210, a third liquid reservoir space 211 and a connecting hole 33. The second intermediate part discharge port 210 opens being opposed to the second upper surface intermediate part of the substrate W that is held by the spin chuck 5 (the part between the center portion of the upper surface and the first upper surface intermediate part of the substrate W). For this preferred embodiment, a plurality of second intermediate part discharge ports 210 are disposed on the circumference surrounding the rotational axis A2 in a concentric manner. The plurality of second intermediate part discharge ports 210 are disposed in the circumferential direction of the opposed member 8, with equal intervals between them, for example. The third liquid reservoir space 211 is a space having a circular annular shape centered around the rotational axis A2, on the inner side of the second liquid reservoir space 209. The chemical liquid can be accumulated in the third liquid reservoir space 211.

The cross-sectional area of the connecting hole 33 is formed with a small enough size so that the chemical liquid is not supplied to the second intermediate part discharge port 210 when the fluid is not flowing between the upper surface peripheral portion 6 of the substrate W and the opposed surface 7. Force acts on the chemical liquid accumulated in the third liquid reservoir space 211 toward the second intermediate part discharge port 210 formed at the bottom part of the liquid reservoir groove 32, by the weight of the chemical liquid itself. However, since the cross-sectional area of the connecting hole 33 is sufficiently small, the chemical liquid does not infiltrate the connecting hole 33 due to the surface tension of the chemical liquid.

The second processing liquid supply unit 206 includes a circular annular liquid reservoir groove 212 provided on the upper spin shaft 22, a connecting channel 213 through which the liquid reservoir groove 212 and each of the liquid reservoir spaces 207, 209 and 211 communicate, and a processing liquid replenishing unit (not shown) that supplies (replenishes) the chemical liquid in the liquid reservoir groove 212. In the example shown in FIG. 12, the arrangement is one wherein the connecting channel 213 includes a common pipe 214 connected to the liquid reservoir groove 212, and a plurality of branch pipes 215 branching from the common pipe 214 and connected to the liquid reservoir spaces 207, 209 and 211, respectively. Alternatively, the connecting channel may be separately connected to the liquid reservoir groove 212 and to each of the liquid reservoir spaces 207, 209 and 211.

In the ozone water supplying step (S3 of FIG. 8) according to the second preferred embodiment as well, ozone water is discharged from the central processing liquid discharge port 9 with the opposed plate 21 disposed at the first proximal position. The ozone water flowing toward the radially outer side between the upper surface peripheral portion 6 of the substrate W and the opposed surface 7 flows from the center portion of the upper surface of the substrate W toward the upper surface peripheral portion 6.

During this time, as the ozone water flows between the upper surface peripheral portion 6 of the substrate W and the part of the opposed surface 7 surrounding the second intermediate part discharge port 210, the pressure is reduced in the second intermediate part discharge port 210 and the connecting hole 33, and the ozone water accumulated in the third liquid reservoir space 211 is guided to the connecting hole 33 by the Venturi effect and discharged from the second intermediate part discharge port 210.

Also, as the ozone water flows between the upper surface peripheral portion 6 of the substrate W and the part of the opposed surface 7 surrounding the first intermediate part discharge port 208, the pressure is reduced in the first intermediate part discharge port 208 and the connecting hole 33, and the ozone water accumulated in the second liquid reservoir space 209 is guided to the connecting hole 33 by the Venturi effect and discharged from the first intermediate part discharge port 208.

Likewise, as the ozone water flows between the upper surface peripheral portion 6 of the substrate W and the part of the opposed surface 7 surrounding the peripheral portion processing liquid discharge port 10, the pressure is reduced in the peripheral portion processing liquid discharge port 10 and the connecting hole 33, and the ozone water accumulated in the first liquid reservoir space 207 is guided to the connecting hole 33 by the Venturi effect and discharged from the peripheral portion processing liquid discharge port 10.

This preferred embodiment exhibits the same function and effect as the first preferred embodiment.

Furthermore, since the liquid reservoir includes liquid reservoir spaces 207, 209 and 211, outflow of the chemical liquid from the liquid reservoir spaces 207, 209 and 211 is effectively restricted in the ozone water supplying step S3. This allows the chemical liquid inside the liquid reservoir to be satisfactorily accumulated.

Figure 13:
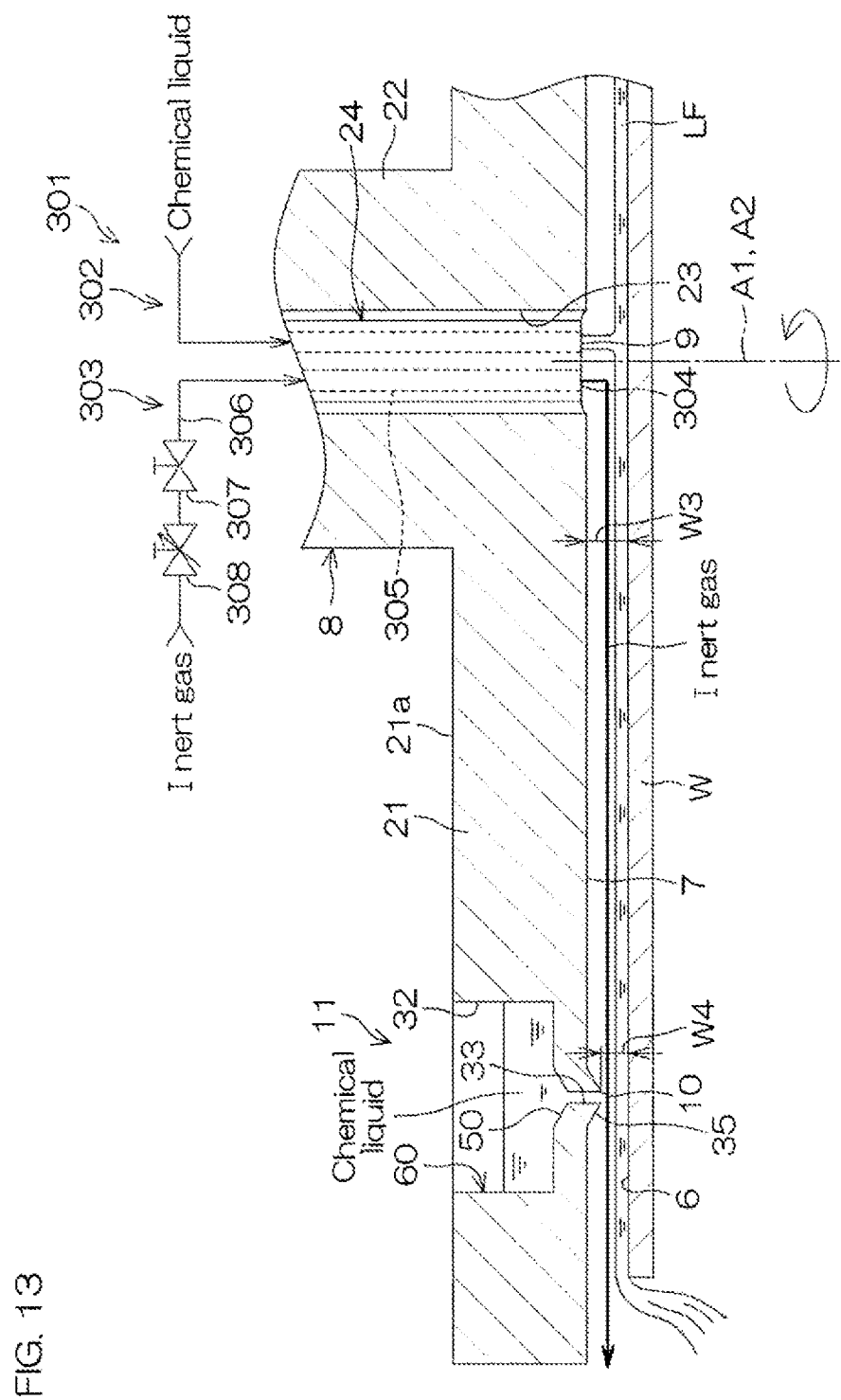
FIG. 13 is a magnified cross-sectional view serving for illustration of an arrangement example of a processing unit of a substrate processing apparatus according to a third preferred embodiment of the present invention.

FIG. 13 is a magnified cross-sectional view serving for illustration of an arrangement example of a processing unit 302 according to a third preferred embodiment of the present invention.

For the third preferred embodiment, the parts corresponding to each part indicated for the first preferred embodiment will be denoted by the same reference numerals as in FIG. 1 to FIG. 11 and will not be explained again.

The substrate processing apparatus 301 of the third preferred embodiment further includes a gas discharge unit 303 for supplying an inert gas (for example, nitrogen gas) to the center portion of the upper surface of the substrate W. The substrate processing apparatus 301 differs from the substrate processing apparatus 1 in this regard.

Moreover, the chemical liquid to be used for processing in the substrate processing apparatus 301, i.e. the chemical liquid discharged from the first processing liquid discharge unit 11, may be a liquid including at least one from among, for example, sulfuric acid, acetic acid, nitric acid, hydrochloric acid, hydrofluoric acid, ammonia water, hydrogen peroxide water, organic acids (such as citric acid or oxalic acid), organic alkalis (such as TMAH: tetramethylammonium hydroxide), organic solvents (such as IPA: isopropyl alcohol), surfactants and corrosion inhibitors.

The gas discharge unit 303 includes a gas nozzle 305 that has a central gas discharge port 304 that opens being opposed to the center portion of the upper surface of the substrate W held by the spin chuck 5 and is inserted into the upper nozzle 24 in a vertically extending manner, a second inert gas pipe 306 connected to the upstream end of the gas nozzle 305, a second inert gas valve 307 for opening and closing the second inert gas pipe 306, and a second flow control valve 308 for adjustment of the degree of opening of the second inert gas pipe 306 to adjust the discharge flow rate. The central gas discharge port 304 is created by a discharge port formed at the tip (bottom end) of the upper nozzle 24 together with the central processing liquid discharge port 9.

The controller 3 (see FIG. 7) controls opening and closing the second inert gas valve 307. The controller 3 also adjusts the degree of opening of the second flow control valve 308.

When the second inert gas valve 307 is opened, the inert gas is discharged from the central gas discharge port 304 toward the center portion of the upper surface of the substrate W. The discharge flow rate of the inert gas from the central gas discharge port 304 can be varied by adjusting the degree of opening of the second flow control valve 308. When the second inert gas valve 307 is opened, the inert gas from the inert gas supply source is discharged downward from the central gas discharge port 304. Thus, when the second inert gas valve 307 is opened with the opposed plate 21 disposed at the second proximal position, the inert gas discharged from the lower surface center portion of the opposed plate 21 spreads downward between the upper surface of the substrate W and the opposed surface 7 of the opposed plate 21 (in a direction away from the rotational axis A1), and the air between the substrate W and the opposed plate 21 is exchanged with the inert gas. The inert gas flowing in the second inert gas pipe 306 is nitrogen gas, for example. The inert gas is not limited to nitrogen gas, and may instead be a different inert gas such as helium gas or argon gas.

Figure 14:
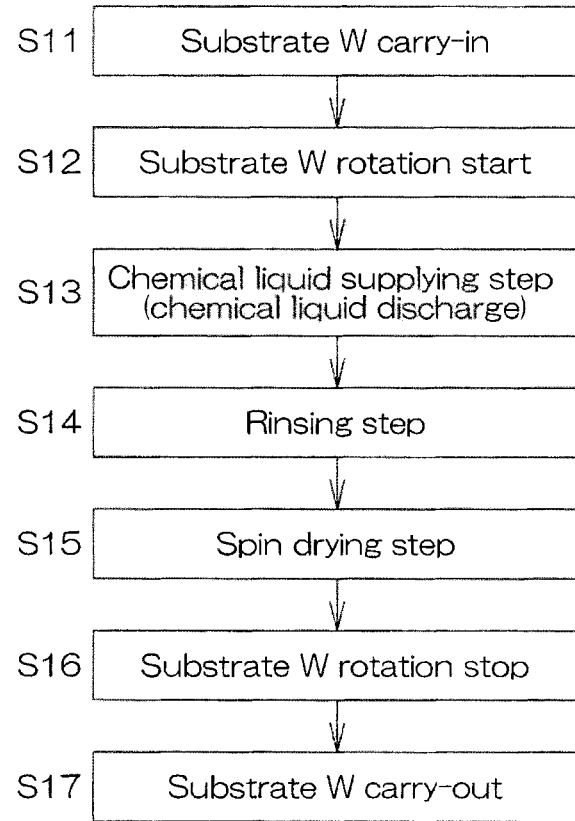
FIG. 14 is a flow diagram serving for illustration of an example of substrate processing performed by the processing unit.

FIG. 14 is a flow diagram serving for illustration of an example of chemical liquid processing carried out by the processing unit 302.

The example of chemical liquid processing will now be explained with reference to FIG. 13 and FIG. 14. FIG. 2, FIG. 3 and FIG. 6 may be referred to as appropriate.

The controller 3 causes the hand of a substrate transfer robot CR (see FIG. 1) holding the substrate W to enter into the chamber 4, with the opposed member 8 disposed at the retreat position and without chemical liquid being accumulated in the liquid reservoir groove 32, such that the substrate W is transferred to the spin chuck 5 with its front surface (pattern-formed surface) oriented upward (step S11: import of substrate). The substrate W thus becomes held by the spin chuck 5.

Next, the controller 3 initiates rotation of the substrate W by the spin motor 17 (step S12). The substrate W is accelerated to a predetermined liquid processing speed (for example, about 800 rpm), which is raised, after which the liquid processing speed is maintained.

Next, a chemical liquid supplying step (step S13) is carried out, in which chemical liquid is supplied to the upper surface of the substrate W to process the upper surface of the substrate W using the chemical liquid. Specifically, the controller 3 controls the opposed member lifting unit 26 to position the opposed plate 21 at the second proximal position. When the opposed plate 21 is at the second proximal position, the interval W3 between the upper surface of the substrate W and the opposed surface 7 of the opposed plate 21 is approximately 5 mm (the interval W4 between the upper surface of the substrate W and the lowermost part of the protrusion 35 is approximately 4.3 mm), and in that state, the opposed plate 21 shields the upper surface of the substrate W from its surrounding space.

After the opposed plate 21 has been disposed at the second proximal position, the controller 3 controls the opposed member rotating unit 25 to rotate the opposed plate 21 around the rotational axis A2. During this time, for example, the rotational direction of the opposed plate 21 is the same direction as the rotational direction of the substrate W, and the rotational speed of the opposed plate 21 is also approximately 800 rpm, or the same as for rotation of the substrate W. Also, after the opposed plate 21 has been disposed at the second proximal position, the controller 3 again opens the first processing liquid valve 30 (see FIG. 2), and opens the second inert gas valve 307.

At this time, opening of the first processing liquid valve 30 causes chemical liquid to be discharged from the central processing liquid discharge port 9 toward the center portion of the upper surface of the substrate W (processing liquid discharging step). The chemical liquid discharged from the central processing liquid discharge port 9 is subjected to centrifugal force by rotation of the substrate W, and flows toward the radially outer side, between the substrate W and the opposed surface 7 of the opposed member 8. Opening of the second inert gas valve 307 causes the inert gas to be discharged from the central gas discharge port 304 toward the center portion of the upper surface of the substrate W. The inert gas that has been discharged from the central gas discharge port 304 flows toward the radially outer side, between the substrate W and the opposed surface 7 of the opposed member 8.

After the opposed plate 21 has been disposed at the second proximal position, the controller 3 also opens the second processing liquid valve 38. By opening of the second processing liquid valve 38, chemical liquid is discharged from the replenishing nozzle 36 toward the liquid reservoir groove 32 (processing liquid supplying step). The chemical liquid supplied to the liquid reservoir groove 32 accumulates in the liquid reservoir groove 32.

Figure 15:
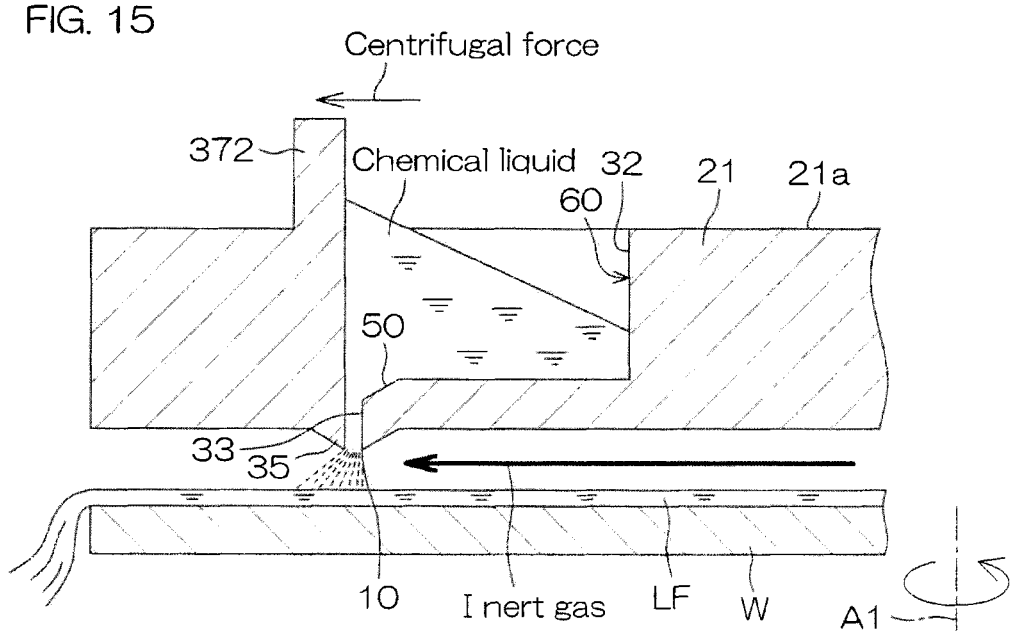
FIG. 15 is a cross-sectional view showing a fourth modification example of a liquid reservoir groove.

The chemical liquid flowing toward the radially outer side between the upper surface peripheral portion 6 of the substrate W and the opposed surface 7 reaches the top of the upper surface peripheral portion 6 of the substrate W. A liquid film LF of the chemical liquid is therefore formed on the upper surface peripheral portion 6 of the substrate W. At this time, as shown in FIG. 13, a layer of inert gas is formed flowing toward the peripheral portion direction, between the opposed surface 7 and the liquid film LF of the chemical liquid. As the inert gas flows between the upper surface peripheral portion 6 of the substrate W and the part of the opposed surface surrounding the peripheral portion processing liquid discharge port 10, the pressure is reduced in the peripheral portion processing liquid discharge port 10 and inside the connecting hole 33, and the chemical liquid accumulated in the liquid reservoir groove 32 is guided to the connecting hole 33 by the Venturi effect and discharged from the peripheral portion processing liquid discharge port 10. As a result, chemical liquid is discharged from each peripheral portion processing liquid discharge port 10 toward the upper surface peripheral portion 6 of the substrate W (processing liquid discharging step). At this time, as shown in FIG. 15 described below, the chemical liquid from the peripheral portion processing liquid discharge port 10 is discharged in atomized form (sprayed). The chemical liquid is thus supplied to the upper surface peripheral portion 6 of the substrate W. Chemical liquid processing of the substrate W is thus carried out in this state, and the upper surface of the substrate W is processed by the chemical liquid.

When the predetermined period from opening of the first processing liquid valve 30 has elapsed, the controller 3 closes the first processing liquid valve 30. The controller 3 also closes the second inert gas valve 307. This completes the chemical liquid supplying step S13. Next, the controller 3 controls the opposed member lifting unit 26 to retreat the opposed plate 21 to the retreat position (the position indicated by the solid line in FIG. 2).

A rinsing step (step S14) is then carried out in which a rinse liquid is supplied to the substrate W. The rinsing step S14 is a step equivalent to the rinsing step of the first preferred embodiment (S4 of FIG. 8).

Next, a spin drying step (step S15) is carried out, in which the substrate W is dried. The spin drying step S15 is a step equivalent to the spin drying step of the first preferred embodiment (S5 of FIG. 8).

Moreover, when the prescribed time has elapsed from the start of high-speed rotation of the substrate W, the controller 3 controls the spin motor 17 to stop rotation of the substrate W by the spin chuck 5 (step S16). Thereafter, the controller 3 controls the opposed member lifting unit 26 to retreat the opposed plate 21 to the retreat position (the position indicated by the solid line in FIG. 2).

The substrate W is then carried outside of the chamber 4 (step S17). Carrying the substrate W outside (S17) is a step equivalent to carrying the substrate W outside for the first preferred embodiment (S7 of FIG. 8).

Thus, according to the third preferred embodiment, discharge of the chemical liquid from the peripheral portion processing liquid discharge port 10 replenishes the chemical liquid between the upper surface peripheral portion 6 of the substrate W and the opposed surface 7, and therefore the chemical liquid can be adequately spread over the upper surface peripheral portion 6 of the substrate W. It is thereby possible to satisfactorily fill not only the region between the center portion of the upper surface of the substrate W and the opposed surface 7, but also the region between the upper surface peripheral portion 6 of the substrate W and the opposed surface 7, with the chemical liquid, and thus to carry out chemical liquid processing evenly over the upper surface of the substrate W.

Furthermore, the peripheral portion processing liquid discharge port 10 and the inside of the connecting hole 33 are brought to reduced pressure as the inert gas flows between the upper surface peripheral portion 6 of the substrate W and the opposed surface 7. With the chemical liquid accumulated in the liquid reservoir groove 32, reduced pressure in the peripheral portion processing liquid discharge port 10 and the inside of the connecting hole 33 causes the chemical liquid accumulated in the liquid reservoir groove 32 to be guided to the connecting hole 33 by the Venturi effect, and to be discharged from the peripheral portion processing liquid discharge port 10. By accumulating the chemical liquid in the liquid reservoir groove 32, the chemical liquid is discharged from the peripheral portion processing liquid discharge port 10 together with distribution of the inert gas between the upper surface peripheral portion 6 of the substrate W and the opposed surface 7. This allows the chemical liquid to be discharged from the peripheral portion processing liquid discharge port 10 without chemical liquid being delivered out through the peripheral portion processing liquid discharge port 10, thereby making it possible to eliminate any arrangement for delivering out the chemical liquid through the peripheral portion processing liquid discharge port 10.

As in the modification example shown in FIG. 15, an embankment 372 may be formed in the opposed plate 21, restricting outflow of the chemical liquid accumulated in the liquid reservoir groove 32 from the liquid reservoir groove 32. Also, as in the modification example shown in FIG. 15, the peripheral portion processing liquid discharge port 10 may be disposed near the peripheral portion edge of the bottom part of the liquid reservoir groove 32.

The embankment 372 is formed so as to rise from the upper surface of the opposed plate 21, upward along the outer peripheral surface of the liquid reservoir groove 32. The embankment 372 has a circular annular shape surrounding the peripheral portion of the liquid reservoir groove 32.

In the substrate processing example described above, in the chemical liquid supplying step S13, the opposed plate 21 is rotated at high speed around the rotational axis A1, and therefore large centrifugal force acts on the chemical liquid accumulated in the liquid reservoir groove 32, but by providing an embankment 372 on the peripheral portion side of the liquid reservoir groove 32, it is possible to effectively restrict outflow of the chemical liquid from the liquid reservoir 60 in the chemical liquid supplying step S13. This allows the chemical liquid inside the liquid reservoir groove 32 to be satisfactorily accumulated.

Figure 16:
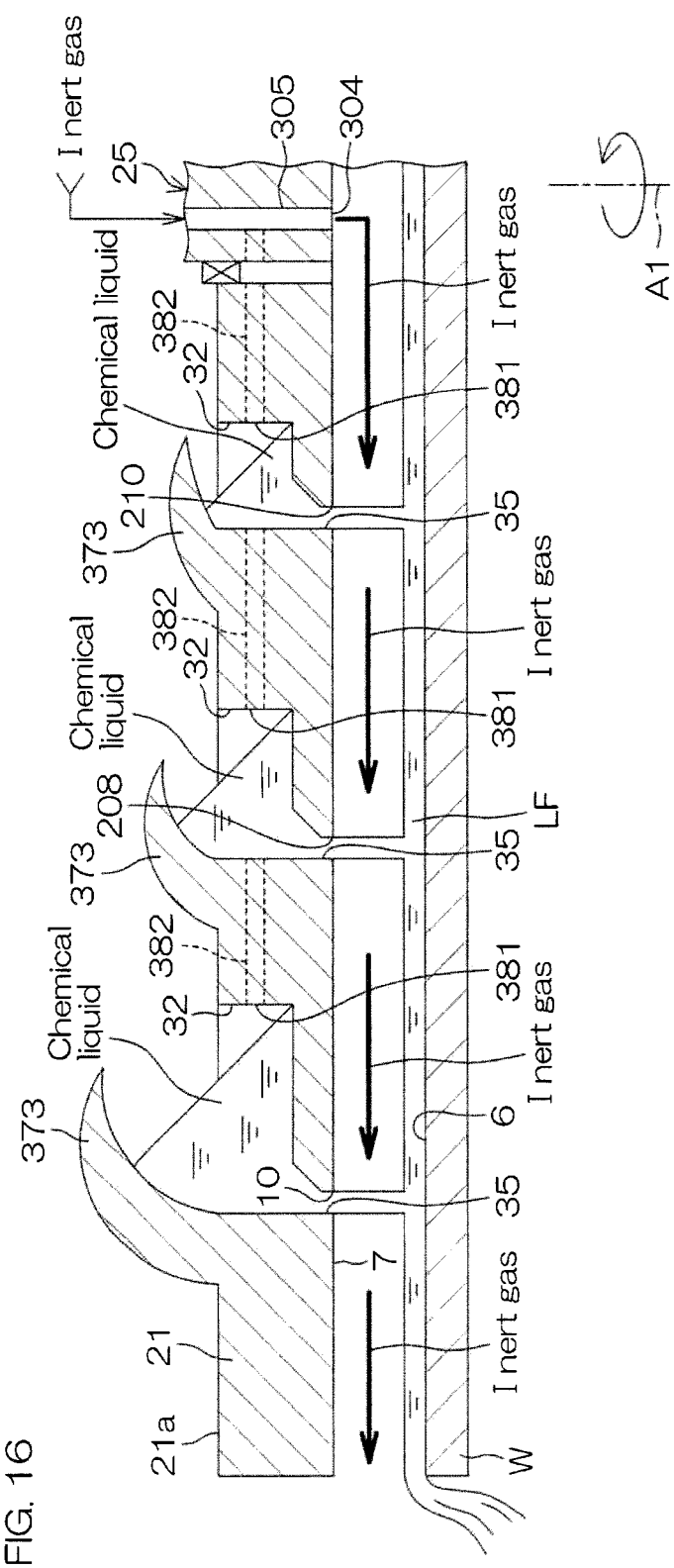
FIG. 16 is a cross-sectional view showing a fifth modification example of liquid reservoir grooves.

As in the modification example shown in FIG. 16, an embankment 373, that restricts outflow of the chemical liquid accumulated in the liquid reservoir groove 32 from the liquid reservoir groove 32, may have an essentially arc-shaped cross-section as it runs upward approaching the rotational axis A1 side. When a plurality of liquid reservoir grooves 32 are provided in a row in the radial direction of the opposed plate 21, the heights of the embankments 373 corresponding to each of the liquid reservoir grooves 32 may increase toward the peripheral portion side of the opposed plate 21, as shown in FIG. 16.

In FIG. 16, gas discharge ports 381 for discharge of inert gas are provided for each of the liquid reservoir grooves 32, to purge the liquid reservoir grooves 32. Each of the gas discharge ports 381 are supplied with inert gas through branch pipes 382 branching from the gas nozzle 305.

FIG. 17 is a cross-sectional view serving for illustration of an arrangement example of a substrate processing apparatus 401 according to a fourth preferred embodiment of the present invention. For the fourth preferred embodiment, the parts corresponding to each part indicated for the second preferred embodiment will be denoted by the same reference numerals as in FIG. 13 and will not be explained again.

The third processing liquid discharge unit 402 of the fourth preferred embodiment differs from the second processing liquid discharge unit 202 of the second preferred embodiment in that, instead of the second processing liquid supply unit 206, it includes a third processing liquid supply unit 406 that supplies chemical liquid to first to third liquid reservoir discharge units 203 to 205 by gas pressure-feeding.

The substrate processing apparatus 401 of the fourth preferred embodiment further also differs from the substrate processing apparatus 201 of the second preferred embodiment in that it further includes a gas discharge unit 303 for supplying an inert gas (for example, nitrogen gas) to the center portion of the upper surface of the substrate W.

The third processing liquid supply unit 406 includes a circular annular liquid reservoir space 412 provided on an upper spin shaft 22, a connecting channel 413 through which the liquid reservoir space 412 and each of the liquid reservoir spaces 207, 209 and 211 communicate, a chemical liquid pressure-feeding unit 416 whereby gas pressure-feeding of the chemical liquid accumulated in the liquid reservoir space 412 takes place to the liquid reservoir spaces 207, 209 and 211 via the connecting channel 413, and a chemical liquid replenishing unit 417 that replenishes the chemical liquid to the liquid reservoir space 412. In the example of FIG. 17, the arrangement is one wherein the connecting channel 413 includes a common pipe 414 connected to the liquid reservoir space 412, and a plurality of branch pipes 415 branching from the common pipe 414 and connected to the liquid reservoir spaces 207, 209 and 211, respectively.

Alternatively, the connecting channel may be separately connected to the liquid reservoir space 412 and to each of the liquid reservoir spaces 207, 209 and 211.

The chemical liquid pressure-feeding unit 416 includes a gas nozzle 418 that blows gas toward the liquid reservoir space 412, a third inert gas pipe 419 that supplies an inert gas such as nitrogen gas to the gas nozzle 418, in a high-pressure state, and a third inert gas valve 420 that opens and closes the third inert gas pipe 419. The inert gas flowing in the third inert gas pipe 419 is nitrogen gas, for example. The inert gas is not limited to nitrogen gas, and may instead be a different inert gas such as helium gas or argon gas.

The gas nozzle 418 is opposed to the liquid reservoir space 412 across a first labyrinth structure 421. Since the first labyrinth structure 421 is provided, it is possible to supply the inert gas from the gas nozzle 418 to the liquid reservoir space 412 while restricting outflow of gas from the liquid reservoir space 412, regardless of the rotational state of the opposed plate 21.

When the third inert gas valve 420 is opened, high-pressure inert gas is blown out from the gas nozzle 418. As a result, the chemical liquid accumulated in the liquid reservoir space 412 is supplied to the liquid reservoir spaces 207, 209 and 211.

The chemical liquid replenishing unit 417 includes a replenishing nozzle 423 that discharges chemical liquid toward the liquid reservoir space 412, a replenishing pipe 424 that supplies the chemical liquid to the replenishing nozzle 423, and a replenishing valve 425 that opens and closes the replenishing pipe 424. The replenishing nozzle 423 is opposed to the liquid reservoir space 412 across a second labyrinth structure 426. Thus, it is possible to supply the chemical liquid from the replenishing nozzle 423 to the liquid reservoir space 412 while restricting outflow of gas from the liquid reservoir space 412, regardless of the rotational state of the opposed plate 21.

The controller 3 (see FIG. 7) controls opening and closing the third inert gas valve 420 and replenishing valve 425.

According to the fourth preferred embodiment, processing is carried out in an equivalent manner to the substrate processing example of the third preferred embodiment. In the chemical liquid supplying step (S13 of FIG. 14), the controller 3 opens the third inert gas valve 420 to supply the chemical liquid toward the liquid reservoir spaces 207, 209 and 211, while the opposed plate 21 is disposed at the second proximal position. The chemical liquid supplied to the liquid reservoir spaces 207, 209 and 211 is accumulated inside the liquid reservoir spaces 207, 209 and 211.

In this state, the controller 3 opens the first processing liquid valve 30 to discharge chemical liquid from the central processing liquid discharge port 9, and opens the second inert gas valve 307 to discharge inert gas from the central gas discharge port 304. The inert gas that has been discharged from the central gas discharge port 304 flows toward the radially outer side, between the substrate W and the opposed surface 7 of the opposed member 8, flowing between the peripheral portion of the upper surface of the substrate W and the peripheral portion of the opposed surface 7. As the inert gas flows between the part of the opposed surface 7 surrounding the peripheral portion processing liquid discharge port 10, the pressure is reduced in the peripheral portion processing liquid discharge port 10 and inside the connecting hole 33, and the chemical liquid accumulated in the liquid reservoir groove 32 is guided to the connecting hole 33 by the Venturi effect and discharged from the peripheral portion processing liquid discharge port 10. As a result, the chemical liquid is discharged from each peripheral portion processing liquid discharge port 10 toward the upper surface peripheral portion 6 of the substrate W.

During this time, as the inert gas flows between the upper surface peripheral portion 6 of the substrate W and the part of the opposed surface 7 surrounding the second intermediate part discharge port 210, the pressure is reduced in the second intermediate part discharge port 210 and inside the connecting hole 33, and the chemical liquid accumulated in the third liquid reservoir space 211 is guided to the connecting hole 33 by the Venturi effect and discharged from the second intermediate part discharge port 210.

Also, as the inert gas flows between the upper surface peripheral portion 6 of the substrate W and the part of the opposed surface 7 surrounding the first intermediate part discharge port 208, the pressure is reduced in the first intermediate part discharge port 208 and inside the connecting hole 33, and the chemical liquid accumulated in the second liquid reservoir space 209 is guided to the connecting hole 33 by the Venturi effect and discharged from the first intermediate part discharge port 208.

Likewise, as the inert gas flows between the upper surface peripheral portion 6 of the substrate W and the part of the opposed surface 7 surrounding the peripheral portion processing liquid discharge port 10, the pressure is reduced in the peripheral portion processing liquid discharge port 10 and inside the connecting hole 33, and the chemical liquid accumulated in the first liquid reservoir space 207 is guided to the connecting hole 33 by the Venturi effect and discharged from the peripheral portion processing liquid discharge port 10.

This preferred embodiment exhibits the same function and effect as the third preferred embodiment.

Four embodiments of the present invention were explained above, but the invention may also be implemented in yet other embodiments.

For example, for the first to fourth preferred embodiments, the cross-sectional areas of the connecting holes 33 may be formed with sizes such that the chemical liquid (processing liquid) is supplied to the discharge ports 10, 208, 210 when the fluid is not flowing between the upper surface peripheral portion 6 of the substrate W and the opposed surface 7.

For the third preferred embodiment, when an embankment 372 (see FIG. 15) is provided on the peripheral portion side of the liquid reservoir groove 32, there may be further provided a hood portion (equivalent to the hood portion 73 of FIG. 11) that protrudes from the top edge of the embankment 372, toward the radially inner side of the opposed plate 21.

Also, for the second to fourth preferred embodiments, a circular annular thick portion 71 may be formed in the opposed surface 7, at the discharge ports 10, 208, 210, further outside in the circumferential direction of the opposed plate 21 than the discharge ports 10, 208, 210, to increase the flow rate of the chemical liquid flowing between the upper surface peripheral portion 6 of the substrate W and the part of the opposed surface 7 surrounding the discharge ports 10, 208, 210.

Moreover, for the first to fourth preferred embodiments, instead of a plurality of discharge ports 10, 208, 210 arranged in the circumferential direction, the discharge ports 10, 208, 210 may be arranged in a circular annular fashion centered around the rotational axis A2. Alternatively, the discharge ports 10, 208, 210 may be disposed in a maldistributed arrangement in the circumferential direction of the opposed plate 21, instead of a plurality of them being provided along the circumferential direction of the opposed plate 21.

Also, in the first to fourth preferred embodiments, the protrusions 35 may be provided intermittently, only at parts corresponding to the surrounding area of the discharge ports 10, 208, 210, instead of being circular annular and centered around the rotational axis A2.

The protrusions 35 of the first to fourth preferred embodiments may also be omitted.

Moreover, for the second preferred embodiment, each of the liquid reservoir spaces 207, 209 and 211 may be a liquid reservoir groove 32 as according to the first preferred embodiment. In other words, liquid reservoir discharge units composed of a discharge port, a liquid reservoir groove 32 and a connecting hole 33 may be provided, not only on the peripheral portion of the opposed member 8 but also at the intermediate part of the opposed member 8 (the part between the center portion of the opposed member 8 and the peripheral portion of the opposed member 8).

Each of the substrate processing examples described above was explained assuming that the substrate W is rotated around the rotational axis A2 concomitantly with supply of the chemical liquid to the substrate W, but the chemical liquid may instead be supplied to the substrate W while rotation of the substrate W is halted.

Moreover, each of the substrate processing examples described above was explained assuming that the opposed plate 21 is retreated to the retreat position in the rinsing step S4, but the opposed plate 21 may instead be disposed at the proximal position.

Also, when the chemical liquid to be discharged from the central processing liquid discharge port 9 has a liquid temperature that is higher than ordinary temperature, it cools during the course of flowing over the upper surface of the substrate W, potentially resulting in reduction in the liquid temperature of the chemical liquid at the upper surface peripheral portion 6 of the substrate W. As a result, the processing rate for the upper surface peripheral portion 6 of the substrate W can potentially be lower than for the center portion of the upper surface of the substrate W.

In this case, chemical liquid having a higher liquid temperature than ordinary temperature (equal to the liquid temperature of the chemical liquid discharged from the central processing liquid discharge port 9) is discharged from the peripheral portion processing liquid discharge port 10. This allows a high liquid temperature to be maintained for the chemical liquid at the upper surface of the substrate W, and can further increase the uniformity of chemical liquid processing on the upper surface of the substrate W.

Moreover, in the substrate processing examples of the first and second preferred embodiments, the explanation assumed that resist removal processing is carried out using ozone water as the processing liquid, but the invention may also be applied to other types of processing (such as processing by etching or washing). In such cases, the chemical liquid to be used as the processing liquid is a liquid including at least one from among, for example, sulfuric acid, acetic acid, nitric acid, hydrochloric acid, hydrofluoric acid, ammonia water, hydrogen peroxide water, organic acids (such as citric acid or oxalic acid), organic alkalis (such as TMAH: tetramethylammonium hydroxide), organic solvents (such as IPA: isopropyl alcohol), surfactants and corrosion inhibitors.

In addition, the processing liquid used in the first to fourth preferred embodiments may include water. The water may be deionized water (DIW), for example, but is not limited to DIW and may instead be carbonated water, electrolytic ion water, hydrogen water or diluted (for example, about 10 ppm to 100 ppm) hydrochloric acid water.

Furthermore, the first to fourth preferred embodiments were explained assuming that the substrate processing apparatuses 1, 201, 301 and 401 are apparatuses that process a discoid substrate, but the substrate processing apparatuses 1, 201, 301 and 401 may instead be apparatuses that process a polygonal substrate, such as a glass panel for a liquid crystal display device.

While preferred embodiments of the present invention have been described in detail above, these are merely specific examples used to clarify the technical contents of the present invention, and the present invention should not be interpreted as being limited only to these specific examples, the spirit and scope of the present invention being limited only by the appended claims.

The present application corresponds to Japanese Patent Application No. 2016-104599 filed on May 25, 2016 at the Japan Patent Office, and Japanese Patent Application No. 2017-003510 filed on Jan. 12, 2017 at the Japan Patent Office, and the entire disclosures of these applications are incorporated herein by reference.

What is claimed is:

1. A substrate processing apparatus including:
a substrate holding unit that holds a substrate horizontally while rotating the substrate around a vertical rotational axis through its center portion,
an opposed member having an opposed surface that is opposed to an upper surface of the substrate, and
a processing liquid discharge unit that includes a center portion discharge port on the opposed surface, that opens being opposed to the center portion of the upper surface of the substrate, and a peripheral portion discharge port on the opposed surface, that opens being opposed to the upper surface peripheral portion of the substrate, that discharges a processing liquid from the center portion discharge port to supply the processing liquid between the substrate and the opposed surface, and discharges the processing liquid from the peripheral portion discharge port to replenish the processing liquid between the substrate and the opposed surface,
wherein the processing liquid discharge unit includes a liquid reservoir provided in the opposed member, that is capable of accumulating the processing liquid discharged from the peripheral portion discharge port, and
a connecting hole through which the inside of the liquid reservoir and the peripheral portion discharge port communicate, and
fluid is distributed between the upper surface peripheral portion of the substrate and the peripheral portion discharge port on the opposed surface, the reduced pressure of the connecting hole as the fluid is distributed, being used to discharge the processing liquid accumulated in the liquid reservoir from the peripheral portion discharge port via the connecting hole.

2. A substrate processing apparatus according to claim 1, wherein the fluid that is distributed between the upper surface peripheral portion of the substrate and the area surrounding the peripheral portion discharge port on the opposed surface is the processing liquid.

3. A substrate processing apparatus according to claim 1, wherein the fluid that is distributed between the upper surface peripheral portion of the substrate and the area surrounding the peripheral portion discharge port on the opposed surface is a gas.

4. A substrate processing apparatus according to claim 1, wherein a protrusion is provided on the opposed surface, in the area surrounding the peripheral portion discharge port, in order to increase the flow rate of the fluid flowing between the upper surface peripheral portion of the substrate and the area surrounding the peripheral portion discharge port on the opposed surface.

5. A substrate processing apparatus according to claim 1, wherein a thick portion is provided on the opposed surface, further toward the peripheral portion of the opposed member than the peripheral portion discharge port, in order to increase the flow rate of the fluid flowing between the upper surface peripheral portion of the substrate and the area surrounding the peripheral portion discharge port on the opposed surface.

6. A substrate processing apparatus according to claim 1, wherein the cross-sectional area of the connecting hole is set to a size such that the processing liquid is not discharged from the peripheral portion discharge port when the processing liquid is not flowing between the upper surface peripheral portion of the substrate and the part of the opposed surface surrounding the peripheral portion discharge port.

7. A substrate processing apparatus according to claim 1, further including a processing liquid supply unit that supplies processing liquid to the liquid reservoir,
wherein the processing liquid supply unit supplies processing liquid to the liquid reservoir when discharge of processing liquid from the center portion discharge port is initiated.

8. A substrate processing apparatus according to claim 1, wherein a plurality of peripheral portion discharge ports are provided along the circumferential direction of the opposed member.

9. A substrate processing apparatus according to claim 1, wherein the substrate processing apparatus is an apparatus that removes a resist from the upper surface of the substrate, and
the processing liquid includes ozone water that removes the resist from the substrate.

10. A substrate processing apparatus including:
a substrate holding unit that holds a substrate horizontally while rotating the substrate around a vertical rotational axis through its center portion, an opposed member having an opposed surface that is opposed to an upper surface of the substrate, and a processing liquid discharge unit that includes a center portion discharge port on the opposed surface, that opens being opposed to the center portion of the upper surface of the substrate, and a peripheral portion discharge port on the opposed surface, that opens being opposed to the upper surface peripheral portion of the substrate, that discharges a processing liquid from the center portion discharge port to supply the processing liquid between the substrate and the opposed surface, and discharges the processing liquid from the peripheral portion discharge port to replenish the processing liquid between the substrate and the opposed surface, wherein the processing liquid discharge unit includes a liquid reservoir provided in the opposed member, that is capable of accumulating the processing liquid discharged from the peripheral portion discharge port, and the liquid reservoir includes a liquid reservoir groove formed on a surface of the opposed member opposite the opposed surface.

11. A substrate processing apparatus according to claim 10, wherein the liquid reservoir further includes an embankment that restricts outflow of the processing liquid that has accumulated in the liquid reservoir groove, from the liquid reservoir groove.

12. A substrate processing apparatus according to claim 11, wherein the liquid reservoir further includes a hood portion that protrudes from the top edge of the embankment toward the radially inner side of the opposed member.

13. A substrate processing apparatus according to claim 10, wherein the liquid reservoir further includes a liquid reservoir space formed inside the opposed member.

* * * * *